(12) United States Patent
Ausserlechner

(10) Patent No.: US 9,310,398 B2
(45) Date of Patent: Apr. 12, 2016

(54) CURRENT SENSOR PACKAGE, ARRANGEMENT AND SYSTEM

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1170 days.

(21) Appl. No.: 13/306,566

(22) Filed: Nov. 29, 2011

(65) Prior Publication Data

US 2013/0138372 A1    May 30, 2013

(51) Int. Cl.
| | |
|---|---|
| G01R 1/04 | (2006.01) |
| G06F 1/30 | (2006.01) |
| G06F 3/02 | (2006.01) |
| G06F 11/22 | (2006.01) |
| G01R 15/20 | (2006.01) |
| G01R 35/00 | (2006.01) |

(52) U.S. Cl.
CPC ............ *G01R 15/207* (2013.01); *G01R 35/005* (2013.01)

(58) Field of Classification Search
CPC ................................ G01R 33/00; G01R 31/34
USPC ......... 702/64, 65, 85, 104, 117, 183; 324/202
See application file for complete search history.

(56) References Cited

U.S. PATENT DOCUMENTS

| | | | |
|---|---|---|---|
| 6,731,105 B1 | 5/2004 | Hoyle et al. | |
| 6,734,660 B1 | 5/2004 | Berkcan et al. | |
| 6,750,644 B1 | 6/2004 | Berkcan | |
| 7,239,123 B2* | 7/2007 | Rannow et al. | 324/117 R |
| 7,923,987 B2* | 4/2011 | Ausserlechner | 324/126 |
| 8,604,777 B2* | 12/2013 | Doogue et al. | 324/202 |
| 2005/0156587 A1 | 7/2005 | Yakymyshyn et al. | |
| 2009/0091344 A1* | 4/2009 | Ausserlechner | 324/763 |
| 2009/0284250 A1 | 11/2009 | Rittmann | |
| 2012/0016614 A1* | 1/2012 | Hohe et al. | 702/85 |
| 2013/0015843 A1* | 1/2013 | Doogue et al. | 324/202 |
| 2013/0057256 A1* | 3/2013 | Ernst et al. | 324/202 |

FOREIGN PATENT DOCUMENTS

| | | |
|---|---|---|
| CN | 101718852 A | 6/2010 |
| CN | 102162819 A | 8/2011 |
| CN | 201945680 U | 8/2011 |
| JP | 2009186214 A | 8/2009 |
| JP | 2009281772 A | 12/2009 |

* cited by examiner

*Primary Examiner* — Gregory J Toatley
*Assistant Examiner* — Felix Suarez
(74) *Attorney, Agent, or Firm* — Eschweiier & Associates, LLC

(57) ABSTRACT

Embodiments of the present invention provide a current sensor package for sensing a current flowing in a primary conductor of a substrate. The current sensor package includes a magnetic field sensor, a calibration current provider and a controller. The calibration current provider is configured to provide a calibration current for a calibration conductor of the substrate, wherein the calibration conductor and the primary conductor are arranged in a defined spatial relation to each other on the substrate. The magnetic field sensor element is configured to sense a magnetic field of the primary current flowing in the primary conductor in order to provide a primary sensor signal and to sense a magnetic field of the calibration current flowing through the calibration conductor to provide a calibration sensor signal. The controller is configured to receive the primary sensor signal and the calibration sensor signal, and to calibrate the primary sensor signal based on the calibration sensor signal and the defined spatial relation between the primary conductor and the calibration conductor.

27 Claims, 13 Drawing Sheets plan view:

cross-section:

plan view:

cross-section:

plan view:

cross-section:

cross-section:

plan view:

cross-section:

CURRENT SENSOR PACKAGE, ARRANGEMENT AND SYSTEM

FIELD

Embodiments of the present invention relate to a current sensor package. Further embodiments of the present invention relate to a current sensor arrangement. Some embodiments of the present invention relate to a current sensor system comprising a printed circuit board and a current sensor package. Some embodiments of the present invention relate to a core-less magnetic current sensor with a calibration wire.

BACKGROUND

Current sensors can be used to measure a current flowing through a conductor. Magnetic current sensors comprise magnetic field sensors to detect a magnetic field of a current flowing through a conductor and use this information to infer the current. Coreless magnetic current sensors are magnetic current sensors without flux-concentrators made of materials with large relative permeability.

SUMMARY

Embodiments of the present invention provide a current sensor package for sensing a current flowing in a primary conductor of a substrate. The current sensor package comprises a magnetic field sensor, a calibration current provider and a controller. The calibration current provider is configured to provide a calibration current for a calibration conductor of the substrate, wherein the calibration conductor and the primary conductor are arranged in a defined spatial relation to each other on the substrate. The magnetic field sensor is configured to sense a magnetic field of the primary current flowing in the primary conductor to provide a primary sensor signal and to sense a magnetic field of the calibration current flowing through the calibration conductor to provide a calibration sensor signal. The controller is configured to receive the primary sensor signal and the calibration sensor signal, and to calibrate the primary sensor signal based on the calibration sensor signal and the defined spatial relation between the primary conductor and the calibration conductor.

Further embodiments of the present invention provide a current sensor arrangement for sensing a current flowing in a primary conductor of a substrate. The current sensor arrangement comprises a magnetic field sensor and a controller. The magnetic field sensor comprises a primary magnetic field sensor unit and a calibration magnetic field sensor unit, wherein the primary magnetic field sensor unit is configured to sense a magnetic field of the primary current flowing through the primary conductor to provide a primary sensor signal. Likewise, the calibration magnetic field sensor unit is configured to sense a magnetic field of a calibration current flowing through a calibration conductor of the substrate to provide a calibration sensor signal. The calibration conductor and the primary conductor are arranged in a defined spatial relation to each other on the substrate. The controller is configured to receive the primary sensor signal and the calibration sensor signal, and to calibrate the primary sensor signal based on the calibration sensor signal and the defined spatial relation between the primary conductor and the calibration conductor.

Some embodiments of the present invention provide a current sensor system comprising a printed circuit board and a current sensor package mounted on the printed circuit board. The printed circuit board comprises a primary conductor and a calibration conductor. The calibration conductor and the primary conductor are arranged in a defined spatial relation to each other on the printed circuit board. The current sensor package comprises a magnetic field sensor, a calibration current provider and a controller. The calibration current provider is configured to provide a calibration current for the calibration conductor of the printed circuit board. The magnetic field sensor is configured to sense a magnetic field of the primary current flowing in the primary conductor to provide a primary sensor signal and to sense a magnetic field of the calibration current flowing through the calibration conductor to provide a calibration sensor signal. The controller is configured to receive the primary sensor signal and the calibration sensor signal, and to calibrate the primary sensor signal based on the calibration sensor signal and the defined spatial relation between the primary conductor and the calibration conductor.

Further embodiments of the present invention provide a means for sensing a primary current flowing in a primary conductor of a substrate. The means for sensing the primary current comprises a means for providing a calibration current for a calibration conductor of the substrate, wherein the calibration conductor and the primary conductor are arranged in a defined spatial relation to each other on the substrate. The means for sensing the primary current further comprises a means for sensing a magnetic field of the primary current flowing in the primary conductor to provide a primary sensor signal and a magnetic field of the calibration current flowing through the calibration conductor to provide a calibration sensor signal, and a means for calibrating the primary sensor signal based on the calibration sensor signal and the defined spatial relation between the primary conductor and the calibration conductor.

Further embodiments of the present invention provide a method for sensing a primary current flowing in a primary conductor of a substrate. The method comprises providing a calibration current for a calibration conductor of the substrate, wherein the calibration conductor and the primary conductor are arranged in a defined spatial relation to each other on the substrate. The method further comprises sensing a magnetic field of the primary current flowing in the primary conductor to provide a primary sensor signal and sensing a magnetic field of the calibration current flowing through the calibration conductor to provide a calibration sensor signal, and calibrating the primary sensor signal based on the calibration sensor signal and the defined spatial relation between the primary conductor and the calibration conductor.

BRIEF DESCRIPTION OF THE DRAWINGS

Embodiments of the present invention are described herein making reference to the appended drawings.

Figure 1A:
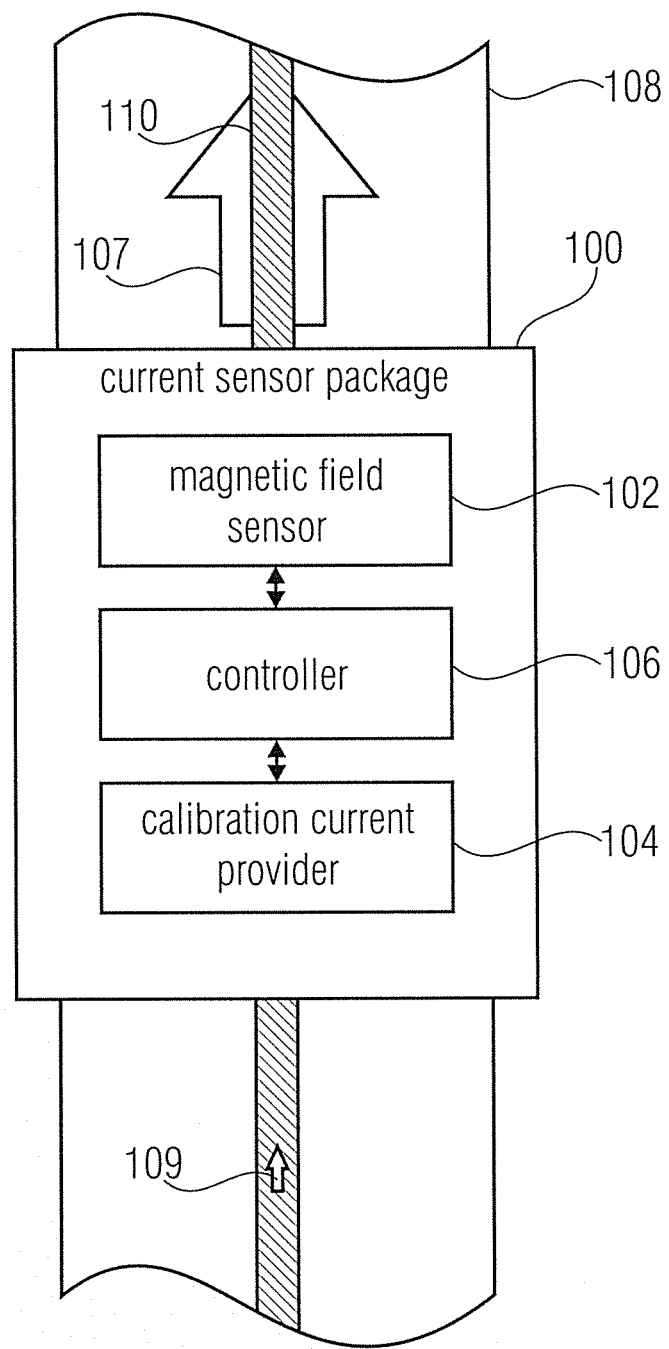
FIG. 1a shows an illustrative view of a current sensor package according to an embodiment of the present invention.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1a shows an illustrative view of a current sensor package 100 according to an embodiment of the present invention. The current sensor package 100 comprises a magnetic field sensor 102, a calibration current provider 104 and a controller 106. The calibration current provider 104 is configured to provide a calibration current 109 for a calibration conductor 110 of the substrate, wherein the calibration conductor 110 and the primary conductor 108 are arranged in a defined spatial relation to each other on the substrate. The magnetic field sensor 102 is configured to sense a magnetic field of the primary current flowing in the primary conductor to provide a primary sensor signal and to sense a magnetic field of a calibration current 109 flowing through the calibration conductor 110 to provide a calibration sensor signal. The controller 106 is configured to receive the primary sensor signal and the calibration sensor signal, and to calibrate the primary sensor signal based on the calibration sensor signal and the defined spatial relation between the primary conductor 108 and the calibration conductor 110.

Note that the primary conductor 108 and the calibration conductor 110 are shown in FIG. 1a merely for illustration purposes. As will become clear from the discussion below, the primary conductor 108 and the calibration conductor 110 can comprise a plurality of different sizes and/or shapes and a plurality of different arrangements with respect to each other and to the current sensor package 100.

In embodiments the current sensor package 100 comprises a magnetic field sensor 102 configured to sense a magnetic field of a primary current 107 flowing in a primary conductor 108. However, the sensed magnetic field does not only depend on the magnitude of the primary current 107, but also on the distance between the primary conductor 108 and the magnetic field sensor 102. In order to improve the accuracy of the current measurement, the current sensor package 100 comprises a calibration current provider 104 and a controller 106. The calibration current provider 104 is configured to provide a calibration current 109 for the calibration conductor 110. The calibration conductor 110 and the primary conductor 108 are arranged in a defined spatial relation to each other on a substrate. Hence, the controller 106 can be configured to calibrate the current measurement based on the calibration sensor signal (describing the sensed magnetic field of the calibration current 109) and the defined spatial relation between the primary conductor 108 and the calibration conductor 110.

In some embodiments the current sensor package 100 can comprise a means for connecting the calibration current provider 104 and the calibration conductor 110 (e.g. to inject the calibration current 109 into the calibration conductor 110 of the substrate).

As already mentioned, the calibration conductor 110 and the primary conductor 108 are arranged on the substrate in a defined spatial relation to each other. In embodiments, the term "defined spatial relation" may refer to a defined, predefined or known distance and/or attitude that can be described by means of an one-, two- or three-dimensional coordinate system, such as a Cartesian or polar coordinate system, or a combination of both. Similar, the term "spatial relation" may refer to a distance and/or attitude that can be described by means of an one-, two- or three-dimensional coordinate system, such as a Cartesian or polar coordinate system, or a combination of both.

According to some embodiments the controller 106 can be configured to determine a spatial relation between the magnetic field sensor 102 and the calibration conductor 110 based on the calibration sensor signal, and to determine a spatial relation between the magnetic field sensor 102 and the primary conductor 108 based on the determined spatial relation between the magnetic field sensor 102 and the calibration conductor 110, and the defined spatial relation between the calibration conductor 110 and the primary conductor 108. The controller 106 can be configured to calibrate the primary sensor signal based on the determined spatial relation between the magnetic field sensor 102 and the primary conductor 108.

In some embodiments the calibration current provider 104 can be configured to provide the calibration current 109 such that a strength of the calibration current 109 is at least by a factor of 100 (or 200, 300, 400, 500, 600, 700, 800, 900 or 1000) smaller than a full scale strength of the primary current 107. Furthermore, the calibration current provider 104 can be configured to provide the calibration current 109 such that a strength of the calibration current 109 is equal to or smaller than 100 mA (or 90, 80, 70, 60, 50, 40, 30, 20 or 10 mA).

For example, if the full scale strength of the primary current 107 to be measured is in the range from 10 to 100 A (or 20 to 90 A, 30 to 80 A, or 40 to 70 A), then the calibration current provider 104 can be configured to provide the calibration current 109 such that a strength of the calibration current 109 is in the range from 10 to 100 mA (or 20 to 90 mA, 30 to 80 mA, or 40 to 70 mA).

In some embodiments the current sensor package 100 can comprise a first pin configured to provide the calibration current 109 for the calibration conductor 110. Furthermore, the current sensor package 100 can comprise a second pin, wherein the first pin and the second pin can be configured to contact the calibration conductor 110.

In the following, a current sensor arrangement 100 according to another embodiment of the present invention is described. Naturally, the following description does also apply to the current sensor package 100 shown in FIG. 1a. In addition, features and embodiments of the current sensor package 100 shown in FIG. 1a do also apply to the current sensor arrangement 100 shown in FIGS. 1b and 1c. Again, the primary conductor 108 and the calibration conductor 110 are shown in FIGS. 1b and 1c merely for illustration purposes.

Figure 1B:
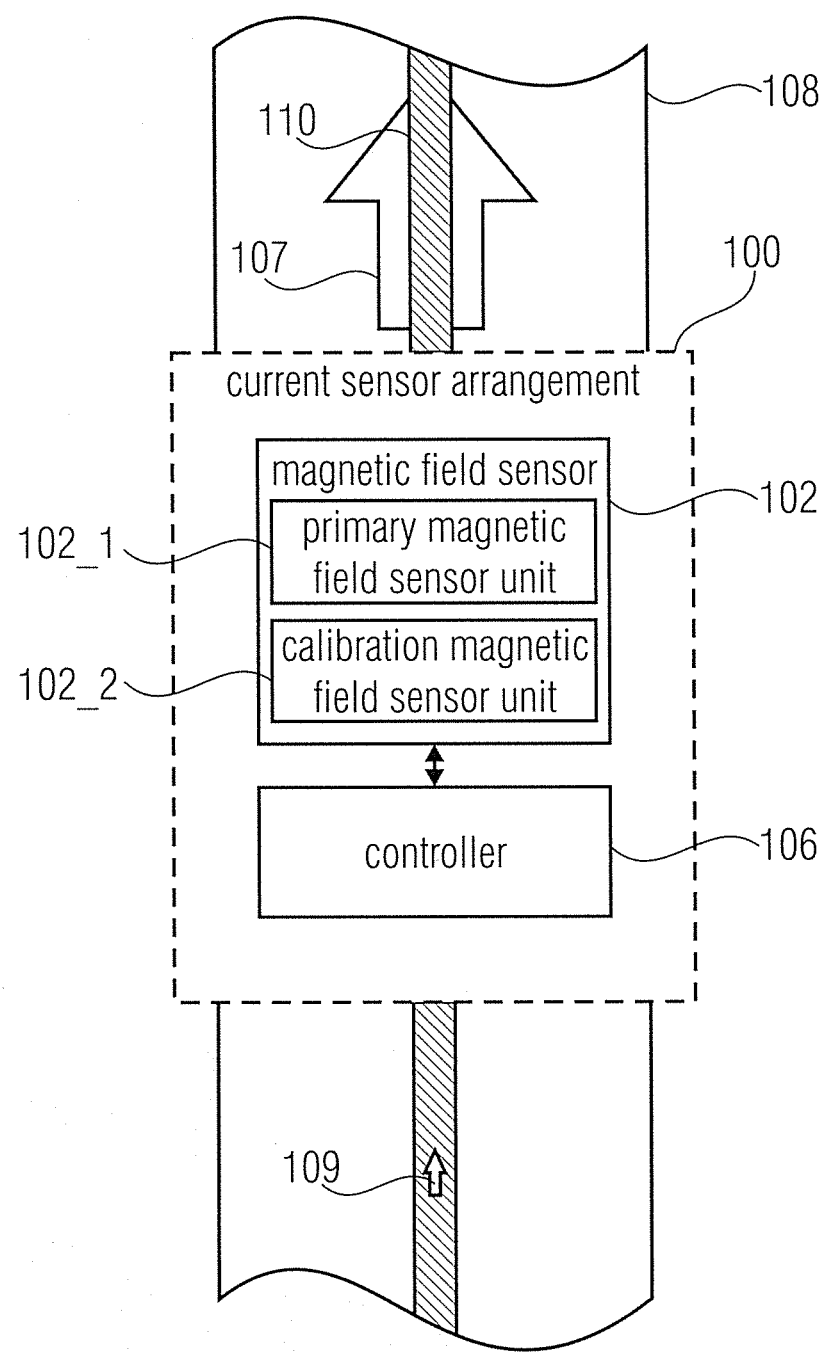
FIG. 1b shows an illustrative view of a current sensor arrangement according to an embodiment of the present invention.
Figure 1C:
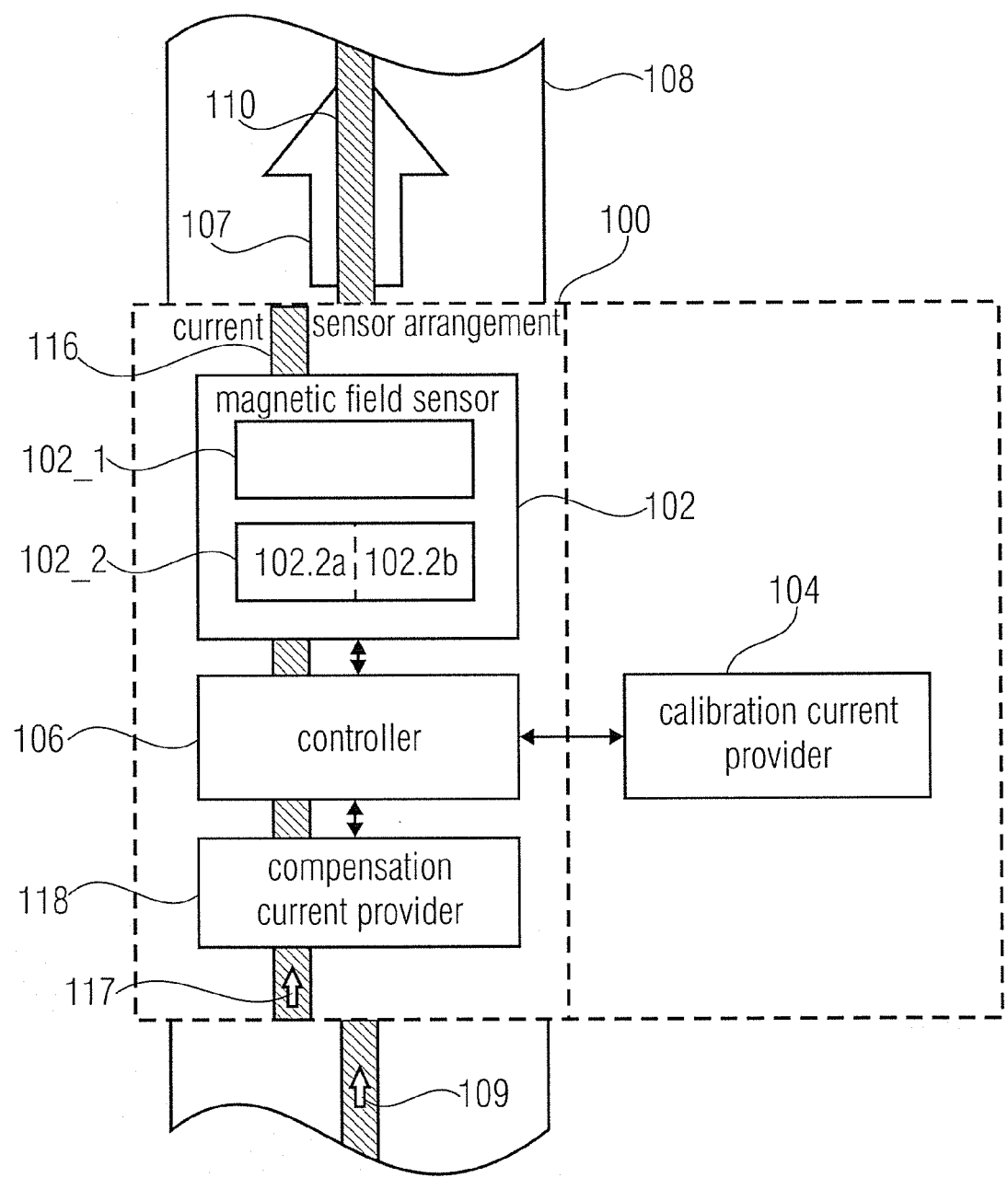
FIG. 1c shows an illustrative view of a current sensor arrangement according to an embodiment of the present invention.

FIG. 1b shows an illustrative view of a current sensor arrangement 100 according to an embodiment of the present invention. The current sensor arrangement 100 comprises a magnetic field sensor 102 and a controller 106. The magnetic field sensor 102 comprises a primary magnetic field sensor unit 102_1 and a calibration magnetic field sensor unit 102_2, wherein the primary magnetic field sensor unit 102_1 is configured to sense a magnetic field of a primary current 107 flowing through a primary conductor 108 of a substrate to provide a primary sensor signal, and wherein the calibration magnetic field sensor unit 102_2 is configured to sense a magnetic field of a calibration current 109 flowing through a calibration conductor 110 of the substrate to provide a calibration sensor signal. The calibration conductor 110 and the primary conductor 108 are arranged in a defined spatial relation to each other on the substrate. The controller 106 is configured to receive the primary sensor signal and the calibration sensor signal, and to calibrate the primary sensor signal based on the calibration sensor signal and the defined spatial relation between the primary conductor 108 and the calibration conductor 110.

According to some embodiments a magnetic field sensitivity of the calibration magnetic field sensor unit 102_2 can be at least by a factor of 10 (or 50, 70, 100, 300, 500, 700 or 1000) higher than a magnetic field sensitivity of the primary magnetic field sensor unit 102_1. For example, the calibration magnetic field sensor unit 102_2 can be an anisotropic, giant, tunnel or colossal magneto resistive sensor unit. The primary magnetic field sensor unit 102_1 can be a Hall-device.

In some embodiments the magnetic field sensor 102 and the controller 106 can be integrated in a current sensor package 100. Moreover, the current sensor package 100 can be mounted on a substrate (e.g. a printed circuit board) comprising the primary conductor 108 and the calibration conductor 110.

Since the calibration current 109 can be small compared to the primary current 107, its magnetic field can be detected with another type of sensor than the magnetic field of the primary conductor 108. For example, a sensor system 100 that detects the magnetic field of the strong primary current 107 through the primary conductor 108 with Hall-plates 102_1 can be used—which, however, detects the magnetic field of the weak calibration current 109 through the calibration conductor 110 with much more sensitive GMR (giant magneto-resistive) sensor elements 102_2. For example, highly sensitive XMRs, e.g. GMR, GMR, AMR, CMR or TMR (GMR=giant magneto resistive, AMR=anisotropic magneto resistive, CMR=colossal magneto resistive, TMR=tunnel magneto resistive) can be used as calibration sensors 102_2 in order to deal with moderate calibration currents. Moreover, in some embodiments the primary sensors 102_1 and the calibrations sensors 102_2 can detect different magnetic field components.

So far, systems 100 have been described that compare the strength of the magnetic field of the calibration current 109 with the strength of the magnetic field of the primary current 107. However, there is also the possibility to detect the spatial dependency of the magnetic field of the calibration current 109 with several calibration sensors 102_2 and to calculate a position tolerance between the sensor system 100 and the calibration conductor 110, and finally to derive therefrom how strong the magnetic field of a fixed primary current 107 is, as will become clear from the following discussion.

FIG. 1c shows a current sensor arrangement 100 according to an embodiment of the present invention. The current sensor arrangement 100 comprises a magnetic field sensor 102 comprising a primary magnetic field sensor unit 102_1 and a calibration magnetic field sensor unit 102_2, and a controller 106 as already described in detail above. The calibration magnetic field sensor unit 102_2 can comprise a first and a second calibration magnetic field sensor element 102_2a and 102_2b arranged in a defined spatial relation to each other, wherein the first and second calibration magnetic field sensor elements 102_2a and 102_2b are configured to sense the magnetic field of the calibration current 109 flowing through the calibration conductor 110 to provide a first and a second calibration sensor signal. The controller 106 can be configured to calibrate the primary sensor signal based on a difference between the first calibration sensor signal and the second calibration sensor signal, and based on the defined spatial relation between the first and second magnetic field sensor elements 102_2a and 102_2b.

For example, two GMR sensors 102_2a and 102_2b can be arranged on the chip 100 such that they sense a magnetic field of the same strength from the calibration conductor 110, with exact positioning of the current sensor package 100 on the substrate (e.g. a printed circuit board). In such a case, the exact known amount of the calibration current 109 does not matter, since only the symmetry is relevant. When both calibration GMRs 102_2a and 102_2b sense, for example, a calibration field differing by 3% in strength, the sensor package 100 can be shifted in one direction by, for example, 0.1 mm with respect to the substrate (e.g. a printed circuit board). This can be considered later by the system 100 when calculating the primary current 107 from the measurement values of the primary current sensors 102_1. With this method, a lateral position tolerance can be corrected, but no vertical one (in thickness direction). For the latter, again, knowledge about the exact strength of the calibration current 109 and the exact magnetic sensitivity of the calibration sensors 102_2a and 102_2b with respect to the primary sensors 102_1 can be required (which, however, is absolutely possible, in particular when the primary magnetic field sensor unit 102_1 and the calibration magnetic field sensor unit 102_2 are of the same type or have been adjusted to each other by the manufacturer).

In some embodiments the current sensor arrangement 100 shown in FIGS. 1b and 1c (and also the current sensor package 100 shown in FIG. 1a) can comprise a compensation conductor 116 arranged in a defined spatial relation to the calibration magnetic field sensor unit 102_2, and a compensation current provider 118 configured to provide a compensation current 117 for the compensation conductor 116. The calibration magnetic field sensor unit 102_2 can be configured to sense a combination of a magnetic field of the compensation current 117 and the magnetic field of the calibration current 109, to provide the calibration sensor signal. The controller 106 can be configured to receive the calibration sensor signal and to control the compensation current provider 118 to provide the compensation current 117 such that the magnetic field of the compensation current 117 and the magnetic field of the calibration current 109 compensate each other at the calibration magnetic field sensor unit 102_2, or to control the calibration current provider 104 based on the calibration sensor signal to provide the calibration current 109 such that the magnetic field of the compensation current and the magnetic field of the calibration current 109 compensate each other at the calibration magnetic field sensor unit 102_2. The controller 106 can be further configured to calibrate the primary sensor signal based on a known strength of the compensation current 117 or a known ratio of strengths of the compensation current 117 and the calibration current 109, and the defined spatial relation between the compensation conductor 116 and the calibration magnetic field sensor unit 102_2.

For example, if only the compensation magnetic field Bcomp of the compensation current 117 (Icomp) is present at the calibration magnetic field sensor unit 102_2, then the output signal of the calibration magnetic field sensor unit 102_2 is given by:

$$V\text{comp}=S\text{cal}*B\text{comp} \quad (I)$$

Thereby, Scal is the magnetic sensitivity of the calibration magnetic field sensor unit 102_2. The compensation magnetic field Bcomp present at the calibration magnetic field sensor unit 102_2 can be calculated to:

$$B\text{comp}=C1*I\text{comp} \quad (II)$$

C1 is a geometrical factor comprising (or describing) the distance between the compensation conductor 116 and the calibration magnetic field sensor unit 102_2.

If only the calibration magnetic field Bcal of the calibration current 109 (Ical) is present at the calibration magnetic field sensor unit 102_2, then the output signal of the calibration magnetic field sensor unit 102_2 is given by:

$$V\text{cal}=S\text{cal}*B\text{cal} \quad (III)$$

The calibration magnetic field Bcal present at the calibration magnetic field sensor unit 102_2 can be calculated to:

$$B\text{cal}=C2*I\text{cal} \quad (IV)$$

Thereby, C2 is a geometrical factor comprising (or describing) the distance between the calibration conductor 110 and the calibration magnetic field sensor unit 102_2. With equations (I) to (IV), C2 can be calculated to:

$$C2=C1*(I\text{comp}/I\text{cal})*(V\text{cal}/V\text{comp}) \quad (V)$$

As shown in equation (V), the distance between the calibration conductor 110 and the calibration magnetic field sensor unit 102_2 coded in C2 depends on the ratio between the compensation current 117 and the calibration current 109.

Alternatively, the compensation current 117 and the calibration current 109 can be provided (or switched on) simultaneously, wherein the calibration magnetic field sensor unit 102_2 can serve as a zero point discriminator. In that case, a locked loop can be used to increase (or decrease) the calibration current 109 or the compensation current 117 until the compensation magnetic field and the calibration magnetic field at the calibration magnetic field sensor unit 102_2 compensate each other (Bcomp+Bcal=0). This leads to:

$$C1*I\text{comp}=-C2*I\text{cal} \quad (VI)$$

Based on equation (VI), C2 can be calculated to:

$$C2=-C1*(I\text{comp}/I\text{cal}) \quad (VII)$$

Again, C2 depends on the ratio between compensation current 117 and calibration current 109. Hence, in that case, a known strength of the calibration current 109 or compensation current 117 may not be required, but rather a known ratio of strengths of the calibration current 109 and the compensation current 117. Even if the compensation current 117 comprises a nonlinear temperature characteristic, the ratio of strengths maintains fixed as long as the calibration current comprises the same nonlinear temperature characteristic.

According to some embodiments, a current mirror can be used to provide the compensation current 117 and the calibration current 109 such that the compensation current 117 and the calibration current 109 comprise a fixed ratio of strengths.

In some embodiments, the current sensor package 100 can comprise a compensation conductor 116, whose current 117 generates a magnetic field at the calibration GMR 102_2. In a locked loop, one of the two currents (compensation current 117 or calibration current 109) can be adjusted by means of a negative feedback such that the sum of the compensation magnetic field and the calibration magnetic field at the calibration GMR 102_2 is (almost) zero. Thus, the calibration GMR 102_2 may serve as a zero point discriminator, which determines that the sum of the compensation magnetic field and the calibration magnetic field equals (almost) zero, instead of measuring the calibration magnetic field. Since the calibration GMR 102_2 and the compensation conductor 116 can be arranged in a defined spatial relation to each other (e.g. both can be positioned ultra-precisely on the chip 100 by exact semiconductor technology production methods), a defined compensation current 117 flowing in the compensation conductor 116 generates a magnetic field of known strength at the calibration GMR 102_2. When the locked loop is fully effective, the magnetic field of the calibration current 109 at the calibration GMR 102_2 has the same size but an opposite sign (than the magnetic field of the compensation current 117). Since the calibration current 109 (or at least the ratio between calibration current 109 and compensation current 117) is known, the system 100 knows the strength of the calibration magnetic field at the calibration GMR 102_2. Since the primary conductor 108 has a defined spatial relation with respect to the calibration conductor 110 and the primary magnetic field sensor unit 102_1 with respect to the calibration GMR 102_2 as well, the system 100 knows the magnetic field per primary current 107 at the primary magnetic field sensor unit 102_1 whereby calibration is given. For that purpose, the calibration GMR 102_2 may have a large magnetic sensitivity, but no defined magnetic sensitivity. Thereby, the magnetic sensitivity of the calibration GMR does not have to be linear. As will become clear from the following mathematical consideration, the magnetic sensitivity of the calibration GMR 102_2 does not influence the calibration of the system 100.

The compensation magnetic field Bcomp at the calibration GMR 102_2 by current flow in the on-chip compensation conductor 116 and the calibration magnetic field Bcal at the calibration GMR 102_2 by current flow in the calibration conductor 110 on the printed circuit board 112 can be calculated to:

$$B\text{comp}=I\text{comp}*C\text{comp} \quad (1)$$

$$B\text{cal}=I\text{cal}*C\text{cal} \quad (2)$$

Thereby, Icomp is the current flow in the compensation conductor 116, Ccomp is the magnetic field at the calibration GMR 102_2 per ampere of the compensation current 117 flowing in the compensation conductor 116 (a purely geometrical function), Ical is the current flow in the calibration conductor 110 and Ccal is the magnetic field at the calibration GMR 102_2 per ampere of the calibration current 109 flowing in the calibration conductor 110. Due to the locked loop Bcomp+Bcal=0, which results in:

$$C\text{cal}=C\text{comp}*I\text{comp}/I\text{cal} \quad (3)$$

Ccomp, Icomp and Ical (right part of equation (3)) are known such that Ccal can be calculated by the system 100.

The magnetic field Bp at the primary field sensor 102_1 by primary field sensor 102_1 by current flow in the primary conductor 108 can be calculated to:

$$Bp = Ip * Cp \quad (4)$$

Thereby, Ip is the primary current 107 to be measured and Cp is the magnetic field at the primary magnetic field sensor unit 102_1 per current flow in the primary conductor 108. The primary magnetic field sensor unit 102_1 can measure Bp and calculate Ip therefrom by means of:

$$Ip = Bp/Cp = Bp * (Ccal/Cp)/Ccal \quad (5)$$

Since the primary conductor 108 and the calibration conductor 110 are exactly aligned with respect to each other (on the printed circuit board 112), the ratio of (Ccal/Cp) is fixed and can be assumed to be known. Further, as explained above, Ccal is known by means of the locked loop. Thus, Bp, Ccal and Cp (right part of equation (5)) are known such that Ip can be calculated by the system 100. As stated, the magnetic sensitivity of the calibration GMR 102_2 is not present in the equations.

According to some embodiments the current sensor arrangement 100 can comprise a calibration current provider 104 configured to provide the calibration current 109 for the calibration conductor 110.

Moreover, the controller 106 can be configured to provide a calibration signal, wherein the calibration current provider 104 can be configured to provide the calibration current 109 based on the calibration signal.

As already mentioned, the magnetic field sensor 102 and the controller 106 can be integrated in a current sensor package 100. Naturally, also the calibration current provider 106 and/or the compensation current provider 118 can be integrated in the current sensor package 100, wherein the compensation conductor 116 can be arranged at the current sensor package 100 or integrated in the current sensor package 100.

For example, the calibration current 109 can be generated by a combination of a subcircuit of the current sensor package 100 and an external passive element (e.g. a resistor, capacitor or inductor). Thereby, the subcircuit can be configured to provide a defined, temperature independent voltage (known as a bandgap voltage), which can be applied to the external resistor. Thus, the current flowing through the resistor can be used directly or after being processed (e.g. rescaled by a current mirror, amplified or attenuated) as the calibration current 109. Thereby, the external resistor can be provided with high accuracy and high stability over temperature and lifetime.

Furthermore, according to some embodiments, the current sensor package 100 can comprise the magnetic field sensor 102 and the controller 106, wherein the calibration current 109 is provided by an external calibration current provider 104. In that case, the current sensor package 100 can be configured to provide the primary sensor signal describing the primary current as multiples of the calibration current.

According to the concept of the present invention, the current sensor package 100 can be mounted on a substrate or printed circuit board comprising the primary conductor 108 and the calibration conductor 110. Thereby, the current sensor package 100 can be mounted on the substrate such that the first pin and the second pin are contacting (or connected to) the calibration conductor 110 in order to inject the calibration current 109 into the calibration conductor 110.

In the following, features of the current sensor package 100 shown in FIG. 1a are described by means of a current sensor arrangement 120 comprising a printed circuit board 112 and a current sensor package 100 mounted on the printed circuit board 112. Naturally, the following description does also apply to the current sensor arrangement 100 shown in FIGS. 1b and 1c.

Figure 2:
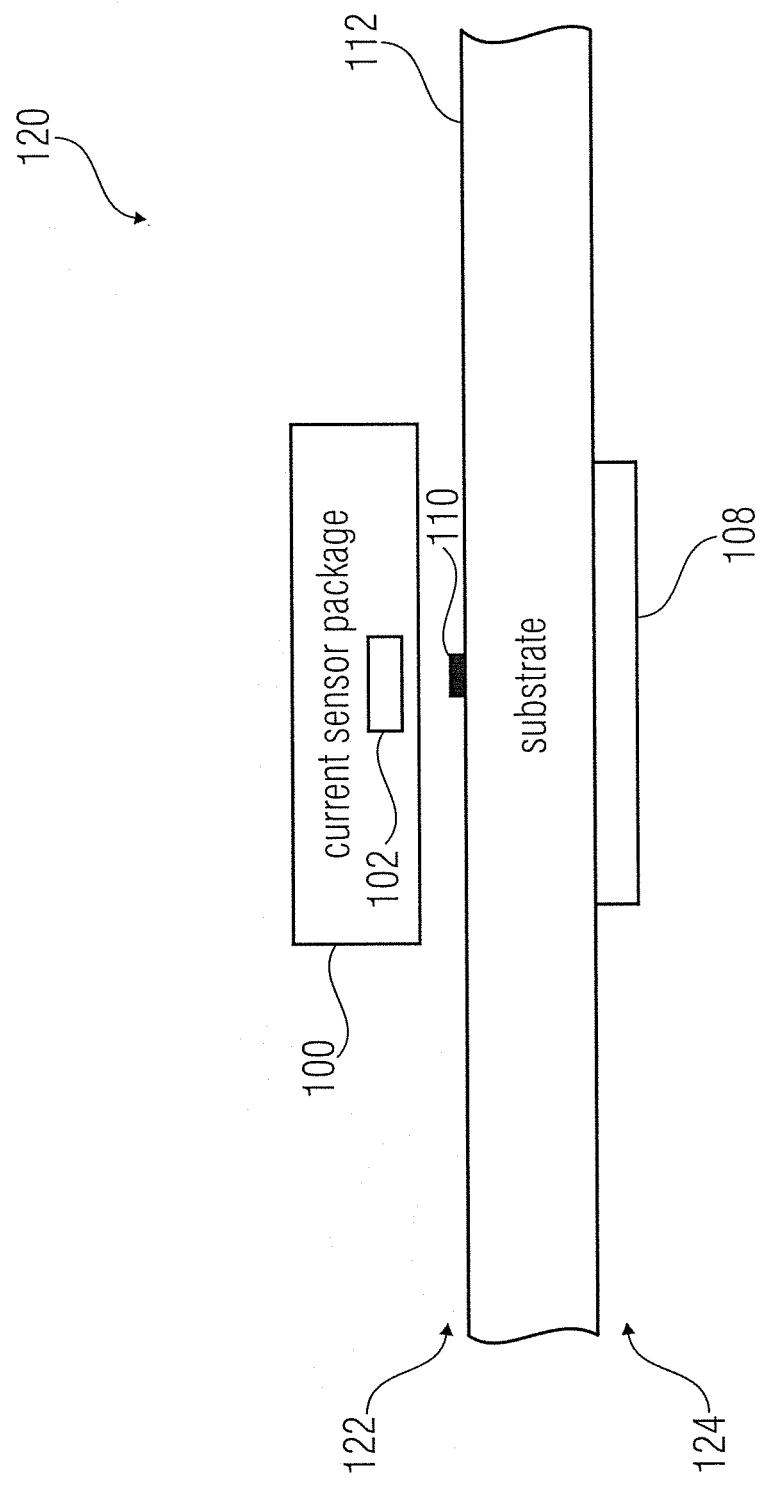
FIG. 2 shows a cross-sectional view of a current sensor system according to an embodiment of the present invention.

FIG. 2 shows a cross-sectional view of a current sensor system 120 according to an embodiment of the present invention. The current sensor system 120 comprises a printed circuit board 112 and a current sensor package 100 mounted on the printed circuit board 112.

The printed circuit board 112 comprises a primary conductor 108 and a calibration conductor 110. The calibration conductor 110 and the primary conductor 108 are arranged in a defined spatial relation to each other on the printed circuit board 112.

The current sensor package 100 comprises a magnetic field sensor 102, a calibration current provider 104 and a controller 106. The calibration current provider 104 is configured to provide a calibration current 109 for the calibration conductor 110. The magnetic field sensor 102 is configured to sense a magnetic field of the primary current 107 flowing in the primary conductor 108 to provide a primary sensor signal (based on the sensed magnetic field of the primary current 107) and a magnetic field of the calibration current 109 flowing through the calibration conductor 110 to provide a calibration sensor signal (based on the sensed magnetic field of the calibration current 109). The controller 106 is configured to receive the primary sensor signal and the calibration sensor signal, and to calibrate the primary sensor signal based on the calibration sensor signal and the defined spatial relation between the primary conductor 108 and the calibration conductor 110.

According to another aspect of the present invention, the current sensor package can comprise a magnetic field sensor 102 and a controller 106. The magnetic field sensor 102 comprises a primary magnetic field sensor unit 102_1 and a calibration magnetic field sensor unit 102_2, wherein the primary magnetic field sensor unit 102_1 is configured to sense a magnetic field of the primary current 107 flowing through the primary conductor 108 to provide a primary sensor signal, and wherein the calibration magnetic field sensor unit 102_2 is configured to sense a magnetic field of a calibration current 109 flowing through the calibration conductor 110 to provide a calibration sensor signal. The controller 106 is configured to receive the primary sensor signal and the calibration sensor signal, and to calibrate the primary sensor signal based on the calibration sensor signal and the defined spatial relation between the primary conductor 108 and the calibration conductor 110.

In other words, the current sensor package 100 can comprise the features of the current sensor package 100 shown in FIG. 1a, and/or the features of the current sensor arrangement 100 shown in FIGS. 1b and 1c, including a combination of both. For example, the magnetic field sensor 102 of the current sensor system 120 can comprise a primary magnetic field sensor unit 102_1 and a calibration magnetic field sensor unit 102_2 as shown in FIG. 1b. Moreover, the calibration magnetic field sensor unit 102_2 can comprise a first and a second calibration magnetic field sensor element 102_2a and 102_2b as shown in FIG. 1c.

As shown in FIG. 2, the calibration conductor 110 can be arranged on a first layer 122 of the printed circuit board 112, wherein the primary conductor 108 can be arranged on a second layer 124 of the printed circuit board 112 different from the first layer 122. Thereby, the current sensor package 100 can be mounted on the printed circuit board 112 such that the first layer 122 of the printed circuit board 100 is closer to the current sensor package 100 than the second layer 124.

Moreover, the primary conductor 108 and the calibration conductor 110 can be electrically isolated from each other.

Figure 3A:
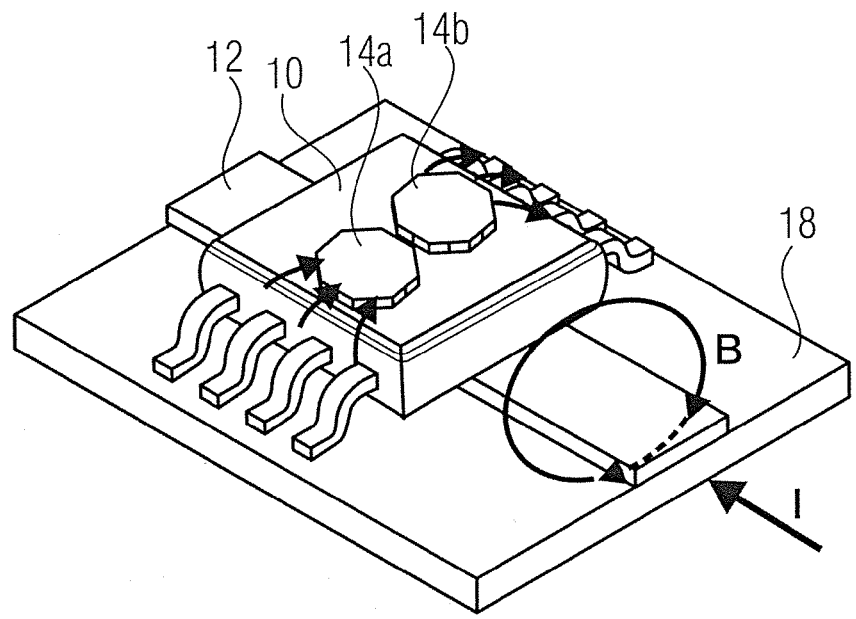
FIG. 3a shows an illustrative view of a known current sensor.
Figure 3B:
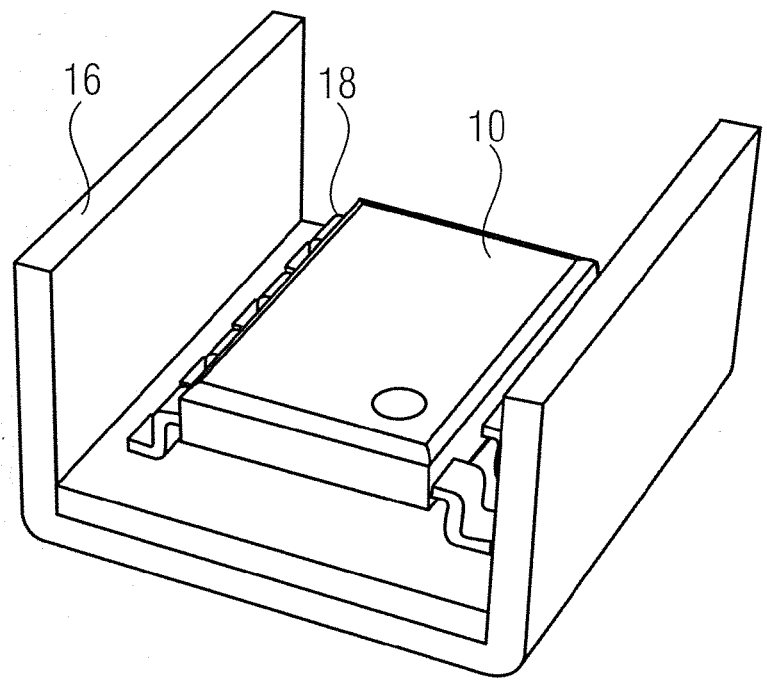
FIG. 3b shows an illustrative view of a known current sensor.

FIGS. 3a and 3b show illustrative views of known current sensors. As shown in FIGS. 3a and 3b, a semiconductor die in a package 10 underneath which the primary current conductor 12 lies is used. The current gives rise to a magnetic flux which is mainly horizontally in the plane of the die surface. There are two highly permeable plates (flux concentrators) 14a and 14b which collect the flux and make a large stray field in between both of them. The stray field has significant vertical contributions on the die surface and can be measured by planar Hall plates. If two Hall plates are used at the two opposing edges of the flux concentrators 14a and 14b they can be subtracted. This cancels homogenous background fields vertically to the die. Yet the system is not robust against horizontal background fields. To this end a U-shaped magnetic shield is proposed, e.g. as shown in FIG. 3b. However, eddy currents in the flux-concentrators and the die paddle of the leadframe and the U-shaped shield still severely limit the bandwidth. Moreover the accuracy of the system is also determined by the distortion of the magnetic field by the permeable shield.

In FIG. 3a a printed circuit board (PCB) with a conductor trace 12 that carries the current to be measured is shown. This trace 12 runs underneath the sensor package 10 and generates a magnetic B-field as indicated in FIG. 3a. FIG. 3b shows how to place a permeable U-shaped magnetic shield 16 around the sensor 10 and the printed circuit board 18.

Figure 4:
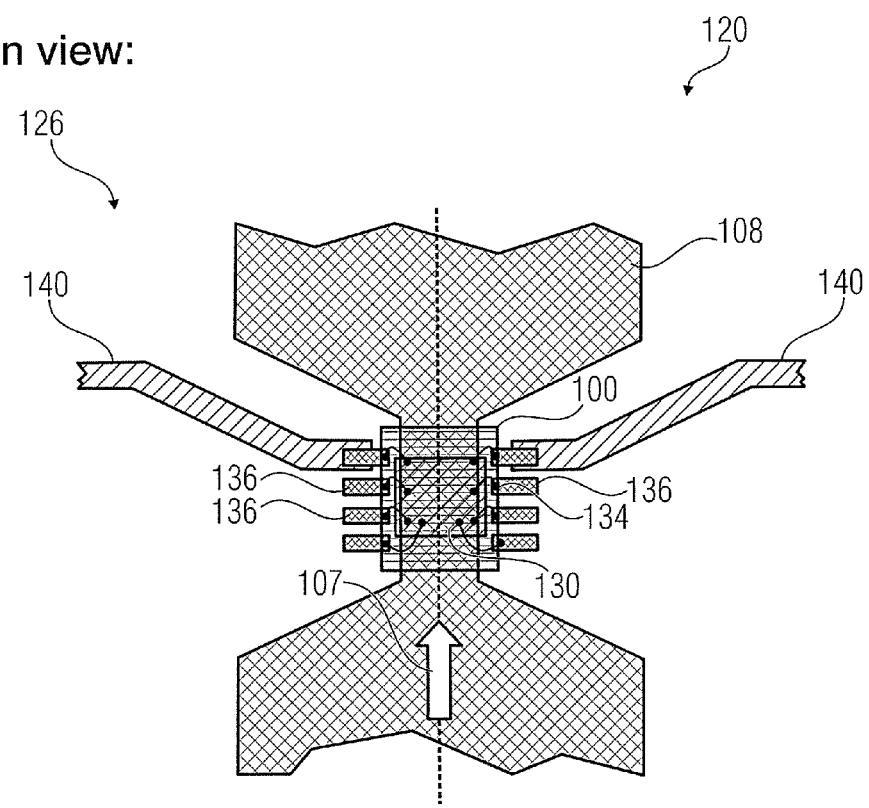
FIG. 4 shows a plan view and a cross-sectional view of a current sensor system without a calibration conductor.
Figure 4:
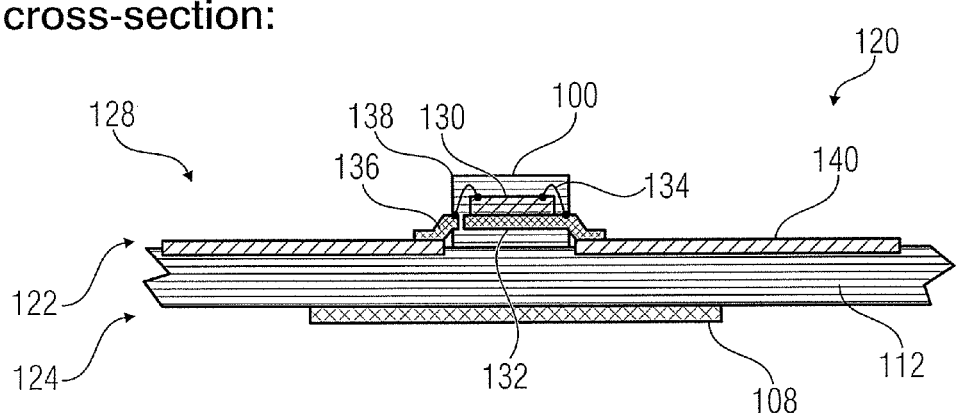

FIG. 4 shows a plan view 126 and cross-sectional view 128 of a current sensor system 120 without a calibration conductor 110. In some embodiments, a semiconductor substrate (or die) 130 comprises magnetic field sensors 102 (not shown). It can be assembled in a conventional surface mounted device package (SMD package) 100 where the die 130 is attached to a lead frame/die-paddle 132 (shown only in the cross-section 128, not in the plan view 126) and connected via bond wires 134 to pins 136 and covered with mold compound 138. This SMD package 100 can be mounted on a printed circuit board (PCB) 112, which comprises fine traces 140 to connect the sensor 100 with other circuit elements of the system 120. For the sake of clarity, only two such traces 140 are shown in FIG. 4. The current to be measured 107 (or primary current 107) flows in one trace 108 (or primary conductor 108), which is usually wider than the others, in order to keep dissipative losses small. This trace 108 can be in the same layer of the printed circuit board 112 or in another layer. For the sake of clarity, the high current trace 108 is drawn to be at the bottom 124 (or second layer 124) of the printed circuit board 112. This would also lead to a good voltage isolation between the high current trace 108 and the rest of the circuit. The current 107 gives rise to a magnetic field, which can be detected by the magnetic field sensor. The magnitude of the field is proportional to the magnitude of the current 107 and so the sensor 100 can estimate the current 107, if the size of the current trace 108 and/or its distance to the sensor elements 102 are known.

Although it is possible to have a well defined shape of the current trace 108, it is usually costly to have a well defined position of the sensor element 102 with respect to the current trace 108. On the one hand, the sensor element 102 on top of the die 130 can have position tolerances within the SMD package 100, which may result from varying die thickness, thickness of die-attach layer between die paddle 132 and die 130, bending of pins 136, and/or solder between pins 136 and traces 140 (not shown). Also the lateral die attach accuracy can be limited to about +/−50 to 150 μm. On the other hand, it can be also difficult to predict warpage of the SMD-package 100 and warpage of the printed circuit board 112, which may result from thermo-mechanic and hydro-mechanic stress. There can be also a significant position tolerance of the SMD-package 100 on the printed circuit board 112, which may result from tolerances of the assembly process.

Besides these position tolerances there may be also ferromagnetic components nearby the sensor 100 which distort the magnetic field of the current 107 to be measured and result in a measurement error.

According to the concept of the present invention, the printed circuit board 112 comprises a primary conductor 108 and a calibration conductor 110. The calibration conductor 110 and the primary conductor 108 are electrically isolated from each other and arranged in a defined spatial relation to each other on the printed circuit board 112. In other words, the printed circuit board 112 comprises a second conductor 110—the calibration wire 110, which is positioned accurately with respect to the high current trace 108 (in both lateral and thickness direction of the layers), yet isolated against it and connected to the magnetic field sensor package 100. The sensor 100 injects a well defined current 109 (or calibration current 109) in this calibration wire 110. It gives rise to a magnetic field, which can be detected by the sensor 100 (or current sensor package 100). The sensor 100 uses this calibration field to calibrate the current measurement. As long as the shape of the magnetic field of the calibration wire 110 is similar to the one of the current 107 to be measured it can reflect all effects of position tolerance and distortion of shape due to nearby ferromagnetic components.

Figure 5:
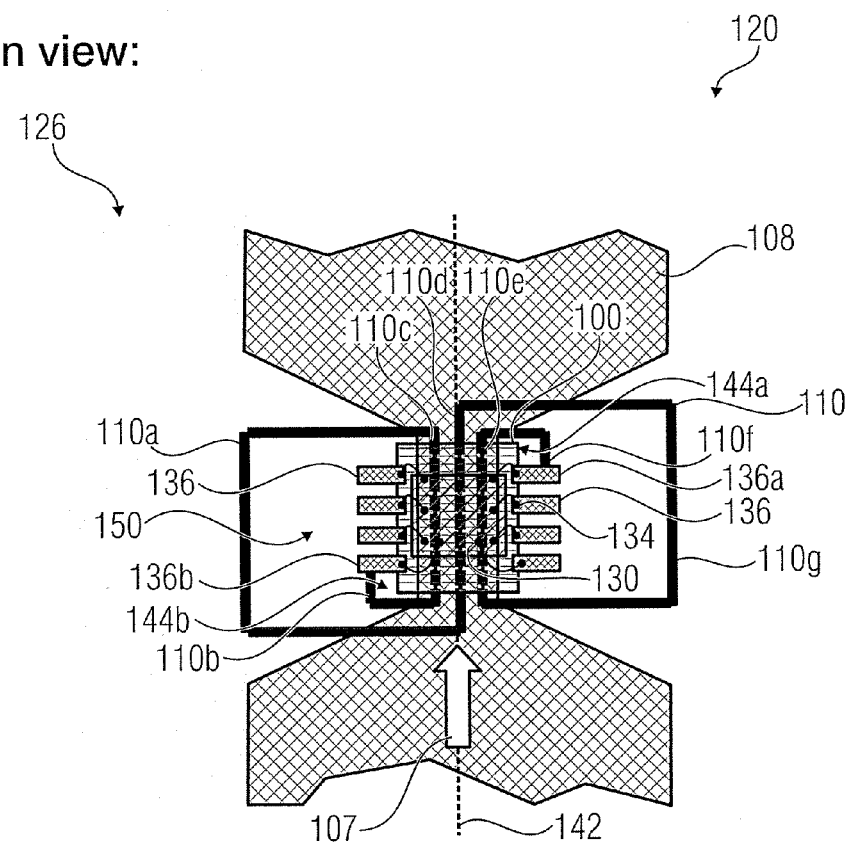
FIG. 5 shows a plan view and a cross-sectional view of a current sensor system according to an embodiment of the present invention.
Figure 5:
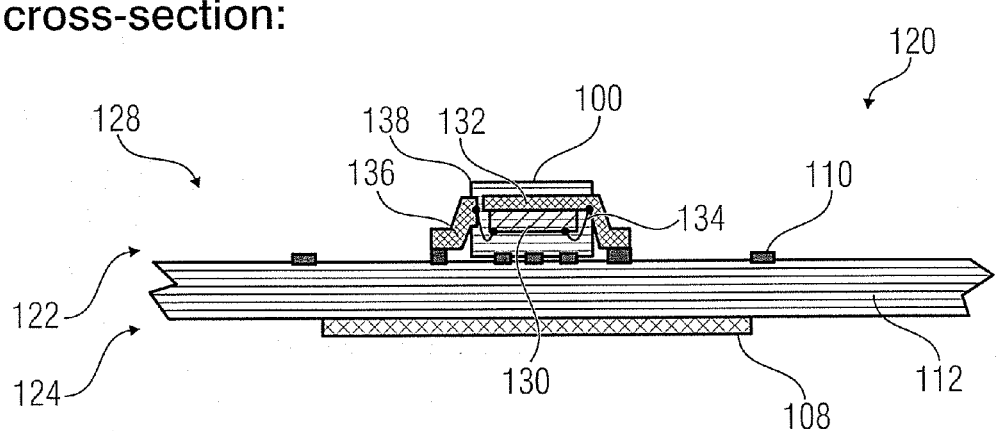

FIG. 5 shows a plan view 126 and a cross-sectional view 128 of a current sensor system 120 according to an embodiment of the present invention. The primary conductor 108 and the calibration conductor 110 can be arranged on the printed circuit board 112 such that the primary conductor 108 and the calibration conductor 110 cross the sensing area of the current sensor package 100. Furthermore, the calibration conductor 110 can be arranged on printed circuit board 112 such that the calibration conductor 110 crosses the sensing area of the current sensor package 100 at least two times.

In some embodiments, the sensing area of the current sensor package 100 can be an area adjacent to the current sensor package 100, for example, the area underneath the current sensor package 100. Moreover, the sensing area of the current sensor package 100 can be the area where a magnitude of the sensed magnetic field of the current to be measured (e.g. primary current 107 and/or calibration current 109) ranges from 10% to 100% of the measurement range of the magnetic field sensor 102.

For example, as shown in FIG. 5, the calibration conductor 110 can comprise seven arms 110a to 110g arranged in a flow direction of the primary current 107, wherein three of the seven arms 110c to 110e cross the sensing area of the current sensor package 100.

The current sensor package 100 can comprises a first pin 136a and a second pin 136b for contacting the calibration conductor 110. The first pin 136a can be arranged at a first side 144a of the current sensor package 100, wherein the second pin 136b can be arranged at a second side 144b of the current sensor package 100 opposite to the first side 144a. The current sensor package 100 can be mounted on the printed circuit board 112 such that the first pin 136a and the second pin 136b are contacting (or connected to) the calibration conductor 110 in order to inject the calibration current 109 into the calibration conductor 110.

In embodiments the current sensor package 100 can comprise four sides 144a to 144d, wherein the first side 144a and the second side 144b can be arranged parallel (or antiparallel)

to a flow direction of the primary current 107 and/or the calibration current 109, and wherein a third side 144c and a fourth side 144d can be arranged perpendicular to the flow direction of the primary current 107 and/or the calibration current 109.

As shown in FIG. 5, the current sensor package 100 can be mounted on the printed circuit board 112 such that the first pin 136a is connected to the sixth arm 110f of the calibration conductor 110 and the second pin 136b is connected to the second arm 110b of the calibration conductor 110.

In some embodiments the primary conductor 108 can comprise a taper 150, wherein the primary conductor 108 can be arranged on the printed circuit board 112 such that the taper 150 is arranged in the sensing area of the current sensor package 100. The taper 150 can be used to increase the current density of the primary current 107 and thus the magnetic field of the primary current 107 in the sensing area of the current sensor package 100.

The calibration wire 110 can be placed on the same surface of the printed circuit board 112 where the sensor 100 is situated, and the high current wire 108 can be placed on a different level, e.g. within the printed circuit board 112 (in a multi-level printed circuit board 112) or on the bottom side 124 (or second layer 124) of the printed circuit board 112. This helps to increase the voltage isolation between the high current and high voltage circuit and the low voltage sense circuit 100. Moreover, the distance between the calibration wire 110 and the sensor 100 can be minimized so that an improved (or even best) quality of the calibration signal is obtained while still keeping the current 109 through the calibration wire 110 small.

The parts of the calibration wire 110 underneath the sensor 100 (i.e. 110c, 110d and 110e) can be aligned in the direction of the main current 107 (or primary current 107). Typically they have minimum line width and minimum pitch—both depend on the technology of the printed circuit board 112. The goal is to cram as many wires underneath the sensor 100 as possible in order to maximize the amp-turns of the calibration coil 110 (or calibration conductor 110) while still keeping the magnitude of the current 109 (or calibration current 109) through it small. The current 109 (or calibration current 109) has to be supplied by the sensor 100 (or more precisely by the calibration current provider 104) and so high calibration currents 109 would increase the dissipation of the sensor 100 and also the die size, because larger active devices (e.g. transistors) may be needed to control larger currents (calibration currents 109). On the other hand, the resistance of the calibration wire 110 should be small enough for the sensor 100 to work with typical supply voltages of e.g. 5V or 3.3V or 3V. If the available supply voltage of the sensor 100 is VDD and the calibration current 109 is Ical, then the resistance of the calibration coil 110 should not exceed VDD/Ical. To this end it may be necessary to use wider current traces at 110a and 110g than at 110c, 110d and 110e. Moreover, also the current traces perpendicular to the primary conductor 108 can be wider than the current traces 110c, 110d and 110e, e.g. the inner traces and/or outer traces.

Note that the magnetic field of trace 110a on the sensor 100—although feeble—has opposite sign than the magnetic field of trace 110g. Therefore, trace 110a should be placed at sufficient distance to trace 110c. Note that the magnetic field of trace 110g on the sensor 100 has opposite sign than the magnetic field of trace 110a. Therefore, traces 110a and 110g should be at equal distances to the sensor 100—then their effects on the sensor 100 cancel. For the same reasons, also the current traces perpendicular to the primary conductor 108 can be arranged at equal distances to the sensor 100. In some embodiments, the layout of the printed circuit board 112 can be symmetric with respect to the vertical dashed line 142 due to magnetic, thermal and/or mechanical stress reasons.

As shown in FIG. 5, a third interconnect layer can be needed to connect all other sensor pins 136, because the calibration wire 110 makes loops around the pins 136. In some embodiments, a three-layer printed circuit board 112 can be used where the middle layer of copper traces can be used to contact the sensor pins 136 or jumpers can be used to cross the calibration wire 110. In principle it is also possible to use long leads, which reach out far to the left and the right of the package 100 and jump over the traces 110a and 110g—yet automatic pick-and-place equipment for assembly of printed circuit boards 112 is probably going to have problems with such long leads. The following embodiments treat this problem.

Figure 6:
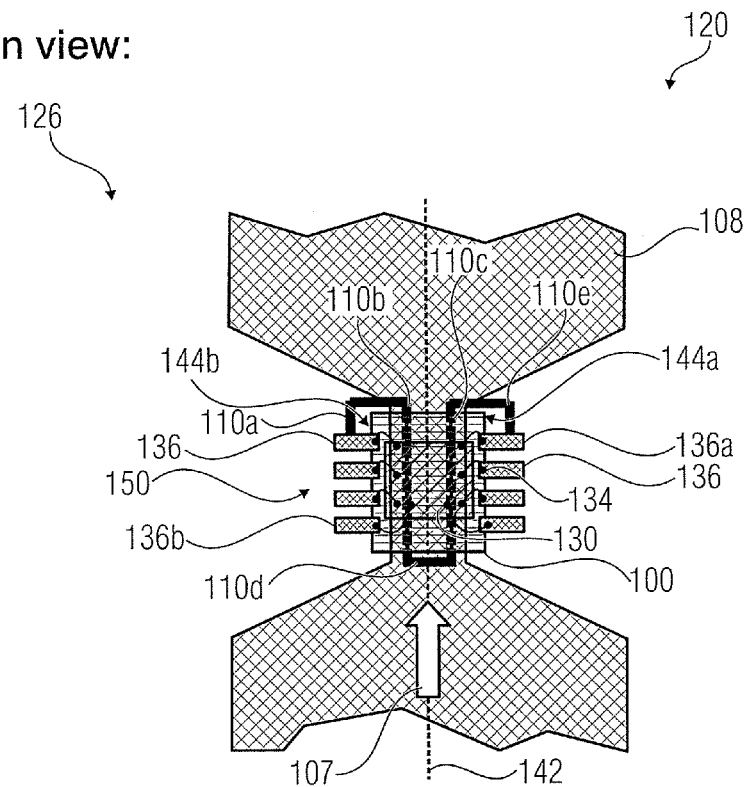
FIG. 6 shows a plan view and a cross-sectional view of a current sensor system according to an embodiment of the present invention.
Figure 6:
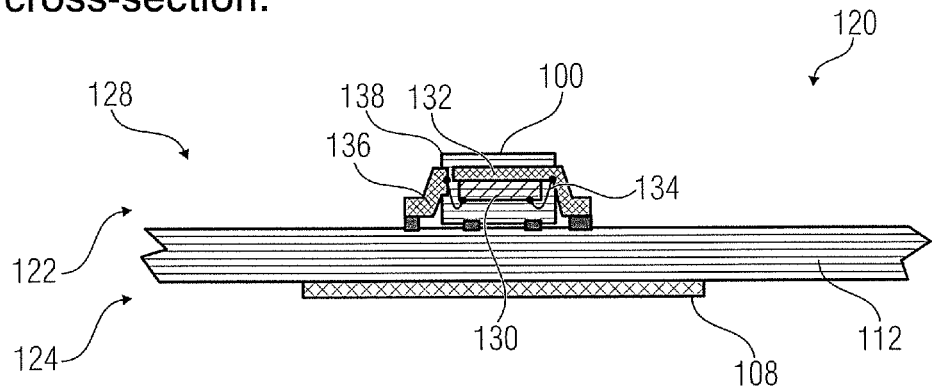

FIG. 6 shows a plan view 126 and a cross-sectional view 128 of a current sensor system 120 according to an embodiment of the present invention. In contrast to FIG. 5, the calibration conductor 110 is arranged on the printed circuit board 112 such that the calibration conductor 110 crosses the sensing area of the current sensor package 100 twice.

Moreover, the calibration conductor 110 can be arranged on the printed circuit board 112 such that the calibration current 109 flows through the sensing area of the current sensor package 100 in a first direction and in a second direction anti-parallel to the first direction such that the magnetic field of the calibration current flowing in the first direction comprises an opposite sign than the magnetic field of the calibration current 109 flowing in the second direction. The first direction can be parallel (or anti-parallel) to a flow direction of the primary current 107.

As shown in FIG. 6, the calibration conductor 110 can comprise a U-shape having a first long arm 110b a second long arm 110c and a short arm 110b, wherein the first long arm 110b and the second long arm 110c are arranged in a flow direction of the primary current 107, and wherein the short arm 110d is arranged perpendicular to the flow direction of the primary current 107.

Figure 7:
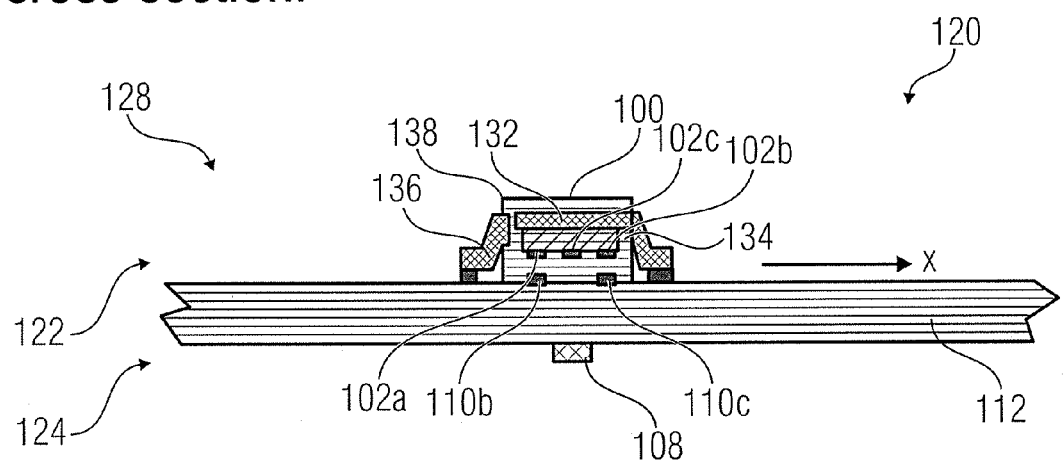
FIG. 7 shows a cross-sectional view of a current sensor system according to an embodiment of the present invention.

In some embodiments, the magnetic field sensor 102 can comprise a first magnetic field sensor element 102a and a second magnetic field sensor element 102b (e.g. as shown in FIG. 7). The first magnetic field sensor element 102a can be configured to sense the magnetic field of the primary current 107 and the magnetic field of the calibration current 109 flowing in the first direction in order to provide a first sensor signal based on the sensed magnetic field of the primary current 107 and the sensed magnetic field of the calibration current 109 flowing in the first direction. The second magnetic field sensor element 102b can be configured to sense the magnetic field of the primary current 107 and the magnetic field of the calibration current flowing in the second direction in order to provide a second sensor signal based on the sensed magnetic field of the primary current 107 and the sensed magnetic field of the calibration current 109 flowing in the second direction.

The controller 106 can be configured to determine a strength of the calibration current 109 based on a subtraction of the first sensor signal and the second sensor signal (e.g. first sensor signal—second sensor signal=calibration sensor signal).

Furthermore, the controller 106 can be configured to determine a strength of the primary current 107 based on an addition of the first sensor signal and the second sensor signal (e.g. first sensor signal+second sensor signal=primary sensor signal).

In some embodiments the first magnetic field sensor element 102*a* can be arranged in the current sensor package 100 such that a sensitivity of the first magnetic field sensor element 102*a* towards the magnetic field of the calibration current 109 flowing in the first arm 110*b* is at least by a factor of 2 (or 3, 5, 8, 10, 50 or 100) higher than towards the magnetic field of the calibration current 109 flowing in the second arm 110. Moreover, the second magnetic field sensor element 102*b* can be arranged in the current sensor package 100 such that a sensitivity of the second magnetic field sensor element 102*b* towards the magnetic field of the calibration current 109 flowing in the second arm 110*c* is at least by a factor of 2 (or 3, 5, 8, 10, 50 or 100) higher than towards the magnetic field of the calibration current 109 flowing in the first arm 110*b*.

For example, the current sensor system 120 can comprise a ring-shaped calibration wire 110. In portion 110*b* of the calibration wire 110, the calibration current 109 can have, but is not limited to have, the same direction as the current 107 (or primary current 107) while in portion 110*c* it can have, but is not limited to have, an opposite direction. Then the magnetic field generated by portion 110*b* is similar to the field of the current 107 (or primary current 107), whereas the field generated by portion 110*c* has the opposite sign. A sensor system 100, which detects the field of current 107 (or primary current 107), may cancel the two contributions of portions 110*b* and 110*c*, so that they do not show up in the total signal (or primary sensor signal, or current sensor output signal describing the primary current) of the sensor 100. However, the system 100 may comprise two subsystems 102*a* and 102*b* (or two magnetic field sensor elements 102*a* and 102*b*), where one is predominantly sensitive to the field of portion 110*b* and the other mainly detects the field of portion 110*c*. If the signals of both subsystems 102*a* and 102*b* are added the contributions of portions 110*b* and 110*c* cancel so that only the contribution of current 107 (or primary current 107) remains—yet if the signals of the two subsystems 102*a* and 102*b* (or two magnetic field sensor elements 102*a* and 102*b*) are subtracted, the result is proportional to the calibration current 109 without any influence of the main current 107. Nevertheless, when considering real positioning tolerances between the current sensor package 100 and the printed circuit board 112, a small part corresponding to the primary current 107 may remain in the calibration sensor signal, where a small part corresponding to the calibration current 109 may remain in the total or primary sensor signal. This can be described by means of a system of linear equations that can always be solved resulting in a linear combination of the calibration sensor signal and the total or primary sensor signal, that is independent on the calibration current, and a second linear combination that is independent on the primary current.

Note that the spatial relation between the primary conductor 108 and the calibration conductor 110 shown in FIG. 3 is meant to be for illustration purposes. In embodiments the primary conductor 108 and the calibration conductor 110 can comprise a plurality of different sizes and/or shapes and a plurality of different arrangements with respect to each other and to the current sensor package 100. For example, if magnetic field sensor elements as shown in FIG. 3*a* or magneto resistive sensor elements are used (i.e. magnetic field sensors sensitive to magnetic field components parallel to the current sensor package 100 and/or printed circuit board 112), then the calibration conductor 110 can be arranged parallel and/or antiparallel to the primary conductor 108. Moreover, if Hall-elements are used (i.e. magnetic field sensors sensitive to magnetic field components perpendicular to the current sensor package 100 and/or printed circuit board 112), then the calibration conductor 100 can be arranged at an arbitrary angle (e.g. between 0° and 90°) or even perpendicular to the primary conductor 108.

FIG. 7 shows a cross-sectional view 128 of a current sensor system 120 according to an embodiment of the present invention. In contrast to FIG. 6, the current sensor package 100 comprises a third magnetic field sensor element 102*c* arranged between the (first) magnetic field sensor element 102*a* and the second magnetic field sensor element 102*b* such that a sensitivity of the third magnetic field sensor element 102*c* towards the magnetic field of the calibration current 109 flowing in the first arm 110*b* and towards the magnetic field of the calibration current 109 flowing in the second arm 110*c* is (almost) the same.

The three magnetic field sensor elements 102*a* to 102*c* shown in FIG. 7 can be sensitive to Bx-fields (to a magnetic field component perpendicular to the flow direction of the primary current 107 and/or calibration current 109, and parallel to the first and/or second layer 122 and 124 of the printed circuit board 112), such as vertical Hall devices or magneto-resistive devices like AMR (AMR=Anisotropic Magneto Resistive) or GMR (GMR=Giant Magneto Resistive) resistors. In the following, a ring-shaped (or u-shaped) calibration wire 110 is assumed where the calibration current 109 flows into the drawing plane of FIG. 7 in portion 110*b* (or first long arm 110*b*) and out of the drawing plane of FIG. 7 in portion 110*c* (or second long arm 110*c*). The portion 110*b* generates Bx>0 on the die 130 surface whereas portion 110*c* generates Bx<0 on the die 130 surface. The sensor system 100 can comprise three magnetic field sensor elements 102*a* to 102*c*, which all detect Bx-fields. In normal operation the system 100 (or more precisely the controller 106) can compute the difference of Bx-fields between portion 102*c* and the average of portion 102*a* plus portion 102*b*: Total signal=Bx(102*c*)−Bx(102*a*)/2−Bx(102*b*)/2. If element 102*c* is placed right between portion 110*b* and portion 110*c* (in a plan view) then the contributions of the current 109 through portion 110*b* and portion 110*c* cancel and so sensor element 102*c* does not respond to the calibration current 109. Yet element 102*a* responds mainly to the current 109 through portion 110*b* and only weakly to the current 109 through portion 110*c* whereas element 102*b* responds only weakly to the current 109 through portion 110*b* and strongly to the current 109 through portion 110*c*. In a calibration mode the system 100 (or more precisely the controller 106) can subtract the Bx-field acting on elements 102*a* and 102*b*. The result of this subtraction is proportional to the calibration current 109 and it may also contain some contributions from the current 107 (or primary current 107) through the primary conductor 108 (this depends on the symmetry of wire 108 with respect to the sensor elements 102*a* to 102*c*). The system 100 (or more precisely the calibration current provider 104) may modulate the calibration current 109 at a particular frequency or at a particular pattern, even at a pseudo-random pattern, in order to discriminate it from the current 107 through wire 108 (or primary conductor 108).

Figure 8:
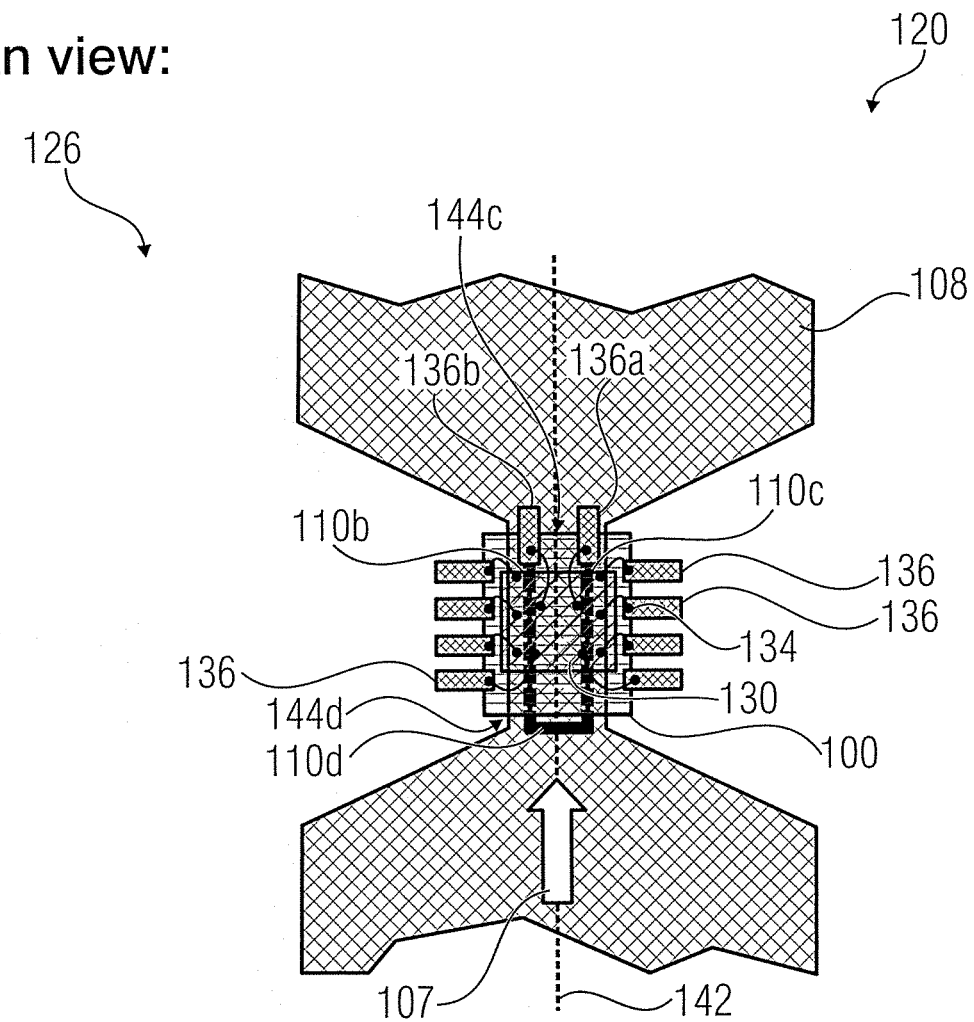
FIG. 8 shows a plan view of a current sensor system according to an embodiment of the present invention.

FIG. 8 shows a plan view 126 of a current sensor system 120 according to an embodiment of the present invention. The calibration conductor can comprise a U-shape having a first long arm 110*b*, a second long arm 110*c* and a short arm 110*b*, wherein the first long arm 110*b* and the second long arm 110*c* are arranged in a flow direction of the primary current 107, and wherein the short arm 110*d* is arranged perpendicular to the flow direction of the primary current 107.

The current sensor package 100 can comprise a first pin 136*a* contacting (or connected to) the second arm 110*c* of the calibration conductor 110 and a second pin 136*b* contacting (or connected to) the first arm 110b of the calibration conductor 110 in order to inject the calibration current 109 into the calibration conductor 110. As shown in FIG. 8, the first pin 136a and the second pin 136b can be arranged at the same side of the printed circuit board 112, e.g. at the third side 144c of the printed circuit bard 112.

In other words, the current sensor package 100 can provide pins 136a and 136b for the calibration current 109 at third and fourth edges of the package 100 as shown in FIG. 8.

Figure 9:
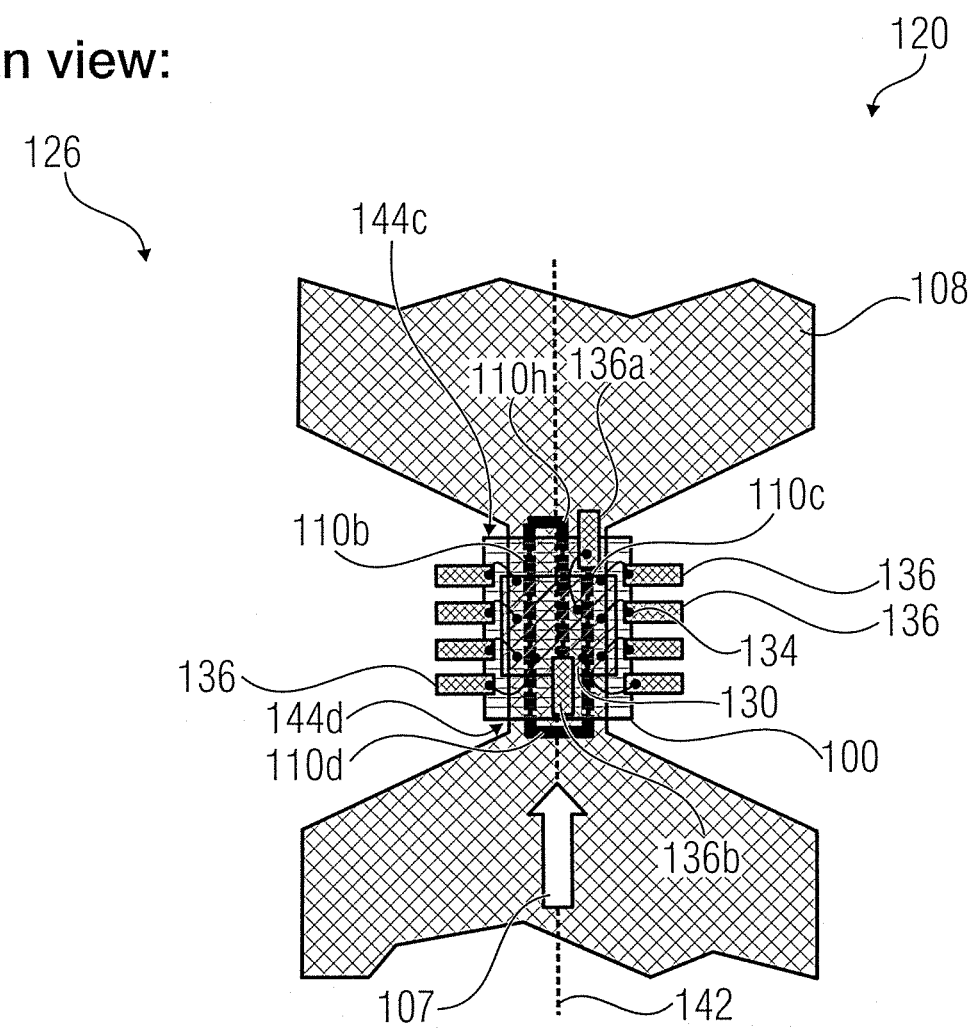
FIG. 9 shows a plan view of a current sensor system according to an embodiment of the present invention.

FIG. 9 shows a plan view 126 of a current sensor system 120 according to an embodiment of the present invention. In contrast to FIG. 8, the calibration conductor 110 comprises a third long arm 110h arranged between the two long arms 110b and 110c such that the third long arm 110h also crosses the sensing area of the current sensor package 100.

The current sensor package 100 can comprise a first pin 136a contacting (or connected to) the second arm 110c of the calibration conductor 110 and a second pin 136b contacting (or connected to) the third arm 110h of the calibration conductor 110 in order to inject the calibration current 109 into the calibration conductor 110. As shown in FIG. 8, the first pin 136a can be arranged at a third side 144c of the printed circuit board 112, wherein the second pin 136b can be arranged at a fourth side 144d of the printed circuit board different from the third side 144c.

In some embodiments, one of the two pins 136a and 136b connected to the calibration wire 110 can also be the ground pin or signal ground or low voltage ground or even the ground of the primary current 107 path. It is also possible to connect one pin 136a or 136b for contacting the calibration wire 110 via a bond-wire with the ground pin. Alternatively the two respective pins 136a and 136b can be connected via a leadframe portion (e.g. they are both extensions of the die paddle 132).

Figure 10:
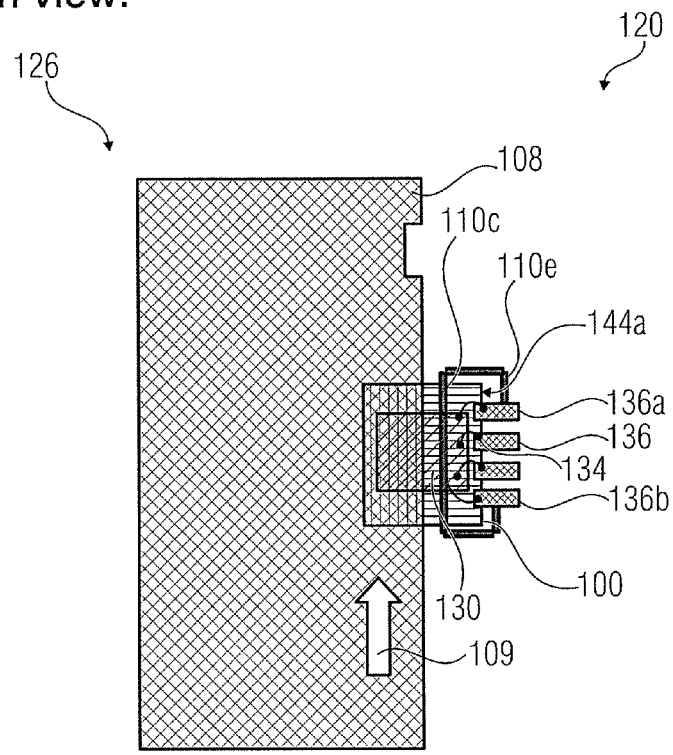
FIG. 10 shows a plan view and a cross-sectional view of a current sensor system according to an embodiment of the present invention.
Figure 10:
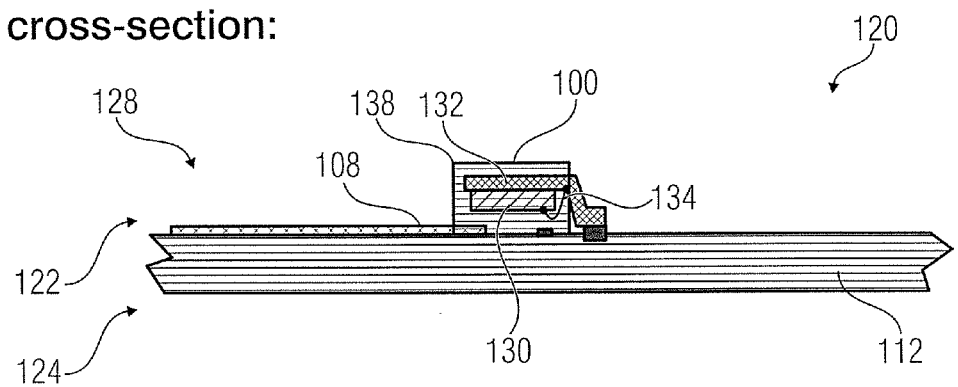

FIG. 10 shows a plan view 126 and a cross-sectional view 128 of a current sensor system 120 according to an embodiment of the present invention. For some applications it can be necessary to place the calibration wire 110 and the primary current trace 108 at the same level (either top 122 of PCB 112 or bottom 124 of PCB 112 or intermediate layer). Reasons for this may be that there is only a single layer available like in DCBs (DCB=Direct Copper Bond) or that the polymer/paper matrix between the conductor layers has poor dimensional stability. In this case a layout may look like it is shown in FIG. 10—in particular it can be possible to have the sensor pins 136a and 136b only at one side of the current sensor package 100, e.g. at the first side 144a of the current sensor package 100.

Some embodiments of the present invention provide a current sensor package 100 that uses at least one sensor pin 136a, which supplies a calibration current 109, generated by the sensor 100. This cal-current 109 (or calibration current 109) is injected into a calibration wire 110 or coil 110, which is placed on the PCB 112 (either on top 122, intermediate or bottom 124 layer). The calibration wire 110 has a well defined geometry and position with respect to the primary conductor 108, which carries the current 107 to be measured. The sensor system 100 compares the magnetic fields generated by the calibration wire 110 with the magnetic field generated by the primary conductor 108. From this ratio it can estimate the ratio of cal-current 109 over primary current 107. If the cal-current 109 is known, the primary current 107 follows.

Further embodiments of the present invention provide a magnetic current sensor package 100 with at least one terminal/pin 136a which supplies a calibration current 109.

Further embodiments of the present invention provide a manufacturing method. The method comprises mounting a magnetic current sensor 100 on a substrate 112 or PCB 112, which carries a primary conductor 108 and a calibration coil 110, where both are in well defined position with respect to each other and the primary conductor 108 is galvanically isolated against the sensor circuit 100 whereas the calibration coil 110 is not galvanically isolated against the sensor circuit 100.

Further embodiments of the present invention provide a magnetic current sensor 100 where the primary conductor 108 and the calibration coil 110 are made in different layers on the substrate/PCB 112 (e.g top 122 and bottom 124 or top 122 and intermediate).

Further embodiments of the present invention provide a magnetic current sensor 100 where the calibration wire 110 is closer to the sensor 100 than the primary conductor 108 (so that the voltage isolation between primary conductor 108 and sensor 100 may be maximized).

Further embodiments of the present invention provide a magnetic current sensor 100 where the calibration wire 110 generates a magnetic field, which mainly suppressed in the signal of the current 108 to be measured (e.g. the calibration wire 110 generates a magnetic field of odd symmetry whereas the primary current 107 generates a field of even symmetry and hence the two can be separated by symmetry).

Further embodiments of the present invention provide a magnetic current sensor 100 where the primary conductor 108 generates a magnetic field, which is mainly suppressed in the signal of the calibration wire 110.

Further embodiments of the present invention provide a magnetic current sensor 100 with calibration wire 110 external to the sensor package 100, where the two ends of the calibration wire 110 are connected to different sides of the sensor package 100 (e.g. the calibration current 109 is supplied by a sensor pin 136a at the right row of pins (first side 144a) whereas the calibration coil 110 is tied to ground at the left (second side 144b) or upper (third side 144c) or lower side (fourth side 144d) of the sensor package 100—note that the ground connection may be made via a dedicated pin or simply via ground plane).

Further embodiments of the present invention provide a magnetic current sensor 100, which is calibrated after installing the package 100 onto the substrate/PCB 112 and/or after all other magnetically disturbing components are installed on this substrate 112. This may happen after assembly in an end-of-line test or repeatedly during operation or service intervals.

Further embodiments of the present invention provide a magnetic current sensor 100 which works in a closed loop, where the calibration current 109 through the calibration wire 110 is adjusted to a specific value, where its magnetic field on the sensor elements 102 cancels the magnetic field of the current 107 through the primary conductor 108. Thereby, the calibration wire 110 is external to the sensor package 100 just like the primary conductor 108.

Figure 11:
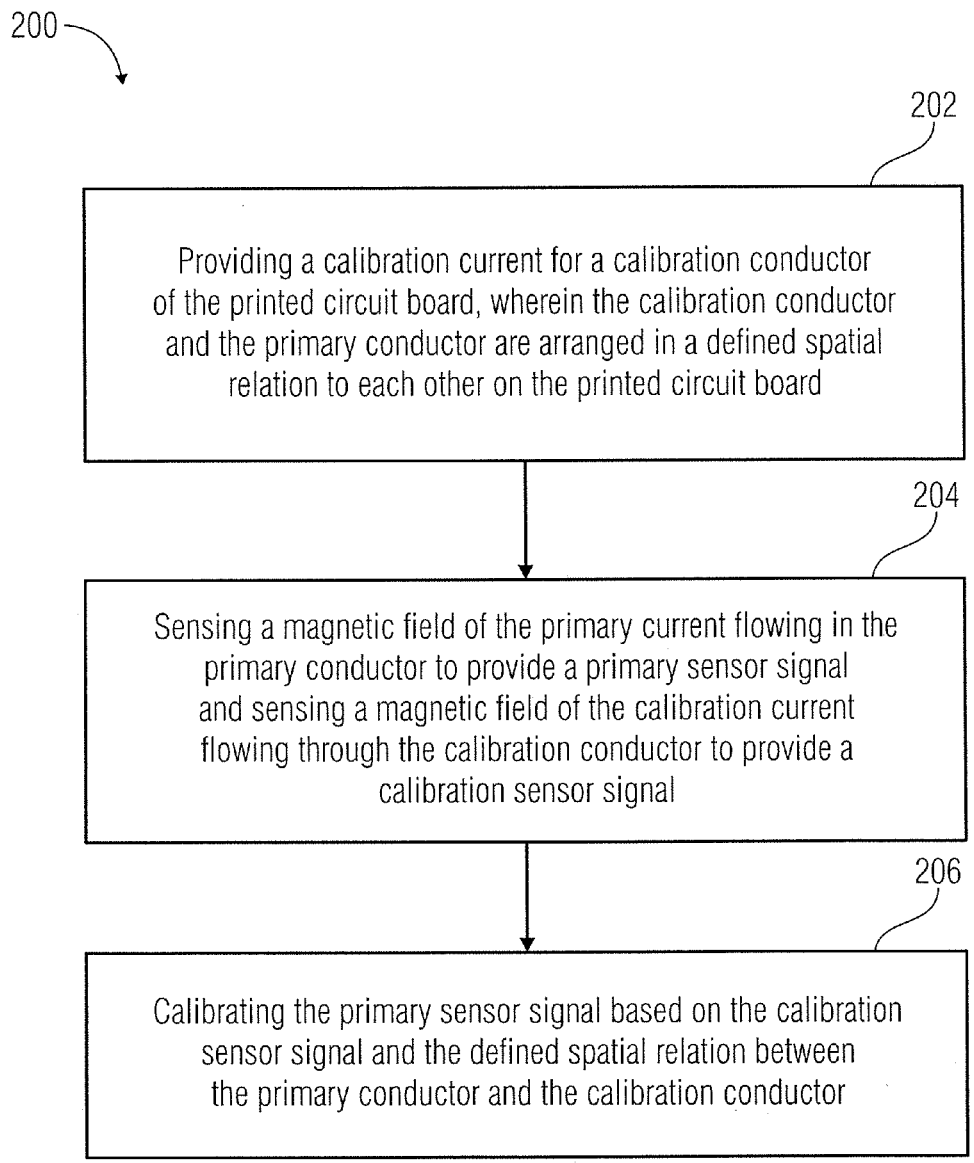
FIG. 11 shows a flow chart of a method for sensing a current flowing in a primary conductor of a printed circuit board.

FIG. 11 shows a flow chart of a method 200 for sensing a primary current flowing in a primary conductor of a substrate. In a step 202 a calibration current is provided for a calibration conductor of the substrate, wherein the calibration conductor and the primary conductor are arranged in a defined spatial relation to each other on the substrate. In a step 204 a magnetic field of the primary current flowing in the primary conductor is sensed to provide a primary sensor signal and a magnetic field of the calibration current flowing through the calibration conductor is sensed to provide a calibration sensor signal. In a step 206 the primary sensor signal is calibrated based on the calibration sensor signal and the defined spatial relation between the primary conductor and the calibration conductor.

In some embodiments the calibration current can be provided such that a strength of the calibration current is at least by a factor of 100 (or 200, 300, 400, 500, 600, 700, 800, 900 or 1000) smaller than a full scale strength of the primary current.

Furthermore, the calibration current can be provided such that a strength of the calibration current is equal to or smaller than 100 mA (or 90, 80, 70, 60, 50, 40, 30, 20 or 10 mA).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block, item or feature of a corresponding apparatus. Some or all of the method steps may be executed by (or using) a hardware apparatus, for example, a microprocessor, a programmable computer or an electronic circuit. In some embodiments, one or more of the most important method steps may be executed by such an apparatus.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment comprises a processing means, for example a computer or a programmable logic device, configured to, or adapted to, perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A current sensor package configured to sense a primary current flowing in a primary conductor of a substrate, the current sensor package comprising:
   a calibration current provider configured to provide a calibration current for a calibration conductor of the substrate, wherein the calibration conductor and the primary conductor are arranged in a defined spatial relation to each other on the substrate, and wherein the primary conductor and the calibration conductor are electrically isolated from each other;
   a magnetic field sensor configured to sense a magnetic field of the primary current flowing in the primary conductor to provide a primary sensor signal, and further configured to sense a magnetic field of the calibration current flowing through the calibration conductor to provide a calibration sensor signal; and
   a controller configured to receive the primary sensor signal and the calibration sensor signal, and configured to calibrate the primary sensor signal based on the calibration sensor signal and the defined spatial relation between the primary conductor and the calibration conductor.

2. The current sensor package according to claim 1, wherein the controller is further configured to determine a spatial relation between the magnetic field sensor and the calibration conductor based on the calibration sensor signal, and configured to determine the spatial relation between the magnetic field sensor and the primary conductor based on the determined spatial relation between the magnetic field sensor and the calibration conductor, and the defined spatial relation between the calibration conductor and the primary conductor;
   wherein the controller is further configured to calibrate the primary sensor signal based on the determined spatial relation between the magnetic field sensor and the primary conductor.

3. The current sensor package according to claim 1, wherein the calibration current provider is configured to provide the calibration current such that a strength of the calibration current is smaller than a full scale strength of the primary current by at least a factor of 100.

4. The current sensor package according to claim 1, wherein the calibration current provider is configured to provide the calibration current such that a strength of the calibration current is equal to or smaller than 100 mA.

5. The current sensor package according to claim 1, wherein the magnetic field sensor comprises a primary magnetic field sensor unit and a calibration magnetic field sensor unit, wherein the primary magnetic field sensor unit is configured to sense the magnetic field of the primary current flowing through the primary conductor to provide the primary sensor signal, and wherein the calibration magnetic field sensor unit is configured to sense the magnetic field of the calibration current flowing through the calibration conductor to provide the calibration sensor signal.

6. The current sensor package according to claim 1, wherein the current sensor package comprises a first pin configured to provide the calibration current for the calibration conductor.

7. The current sensor package according to claim 6, wherein the current sensor package comprises a second pin, wherein the first pin and the second pin are configured to contact the calibration conductor.

8. A current sensor arrangement for sensing a primary current flowing in a primary conductor of a substrate, the current sensor comprising:
   a magnetic field sensor comprising a primary magnetic field sensor unit and a calibration magnetic field sensor unit, wherein the primary magnetic field sensor unit is configured to sense a magnetic field of the primary current flowing through the primary conductor to provide a primary sensor signal, and wherein the calibration magnetic field sensor unit is configured to sense a magnetic field of a calibration current flowing through a calibration conductor of the substrate to provide a calibration sensor signal, wherein the calibration conductor and the primary conductor are arranged in a defined spatial relation to each other on the substrate; and a controller configured to receive the primary sensor signal and the calibration sensor signal, and configured to calibrate the primary sensor signal based on the calibration sensor signal and the defined spatial relation between the primary conductor and the calibration conductor.

9. The current sensor arrangement according to claim 8, wherein a magnetic field sensitivity of the calibration magnetic field sensor unit is higher than a magnetic field sensitivity of the primary magnetic field sensor unit by at least a factor of 10.

10. The current sensor arrangement according to claim 9, wherein the calibration magnetic field sensor unit is an anisotropic, giant, tunnel or colossal magneto resistive sensor unit.

11. The current sensor arrangement according to claim 8, wherein the calibration magnetic field sensor unit comprises a first calibration magnetic field sensor element and a second calibration magnetic field sensor element arranged in a defined spatial relation to each other, wherein the first calibration magnetic field sensor element and the second calibration magnetic field sensor element are configured to sense the magnetic field of the calibration current flowing through the calibration conductor to provide a first calibration sensor signal and a second calibration sensor signal; and wherein the controller is configured to calibrate the primary sensor signal based on a difference between the first calibration sensor signal and the second calibration sensor signal, and based on the defined spatial relation between the first magnetic field sensor element and the second magnetic field sensor element.

12. The current sensor arrangement according to claim 8, wherein the magnetic field sensor and the controller are integrated in a current sensor package.

13. The current sensor arrangement according to claim 8, further comprising a calibration current provider configured to provide the calibration current for the calibration conductor.

14. The current sensor arrangement according to claim 13, wherein the controller is configured to provide a calibration signal wherein the calibration current provider is configured to provide the calibration current based on the calibration signal.

15. The current sensor according to claim 8, wherein the current sensor comprises a compensation conductor arranged in a defined spatial relation to the calibration magnetic field sensor unit, and a compensation current provider configured to provide a compensation current for the compensation conductor;

wherein the calibration magnetic field sensor unit is configured to sense a combination of a magnetic field of the compensation current and the magnetic field of the calibration current, to provide the calibration sensor signal;

wherein the controller is configured to receive the calibration sensor signal and configured to control the compensation current provider to provide the compensation current such that the magnetic field of the compensation current and the magnetic field of the calibration current compensate each other at the calibration magnetic field sensor unit, or configured to control the calibration current provider based on the calibration sensor signal to provide the calibration current such that the magnetic field of the compensation current and the magnetic field of the calibration current compensate each other at the calibration magnetic field sensor unit; and wherein the controller is further configured to calibrate the primary sensor signal based on a known ratio of strengths of the compensation current and the calibration current, and the defined spatial relation between the compensation conductor and the calibration magnetic field sensor unit.

16. A current sensor system, comprising:
a printed circuit board; and
a current sensor package mounted on the printed circuit board;

wherein the printed circuit board comprises a primary conductor and a calibration conductor, wherein the calibration conductor and the primary conductor are arranged in a defined spatial relation to each other on the printed circuit board, and wherein the primary conductor and the calibration conductor are electrically isolated from each other; and wherein the current sensor package comprises:
a calibration current provider configured to provide a calibration current for the calibration conductor of the printed circuit board;
a magnetic field sensor configured to sense a magnetic field of the primary current flowing in the primary conductor to provide a primary sensor signal and configured to sense a magnetic field of the calibration current flowing through the calibration conductor to provide a calibration sensor signal; and
a controller configured to receive the primary sensor signal and the calibration sensor signal, and configured to calibrate the primary sensor signal based on the calibration sensor signal and the defined spatial relation between the primary conductor and the calibration conductor.

17. The current sensor system according to claim 16, wherein the calibration conductor is arranged on a first layer of the printed circuit board and wherein the primary conductor is arranged on a second layer of the printed circuit board different from the first layer.

18. The current sensor system according to claim 16, wherein the current sensor package is mounted on the printed circuit board such that the first layer of the printed circuit board is closer to the current sensor package than the second layer.

19. The current sensor system according to claim 16, wherein the primary conductor and the calibration conductor are arranged on the printed circuit board such that the primary conductor and the calibration conductor cross a sensing area of the current sensor package.

20. The current sensor system according to claim 19, wherein the calibration conductor is arranged on the printed circuit board such that the calibration conductor crosses the sensing area of the current sensor package at least twice.

21. The current sensor system according to claim 20, wherein the calibration conductor is arranged on the printed circuit board such that the calibration current flows through the sensing area of the current sensor package in a first direction and in a second direction, wherein the magnetic field of the calibration current flowing in the first direction and the magnetic field of the calibration current flowing in the second direction are of odd symmetry, and wherein the magnetic field of the primary current is of even symmetry.

22. The current sensor system according to claim 20, wherein the calibration conductor comprises a U-shape with a first long arm, a second long arm and a short arm, wherein the first long arm and the second long arm are arranged in a flow direction of the primary current and wherein the short arm is arranged perpendicular to the flow direction of the primary current, wherein the first long arm and the second long arm cross the sensing area of the current sensor package.

23. The current sensor system according to claim 19, wherein the primary conductor comprises a taper, wherein the primary conductor is arranged on the printed circuit board such that the taper is arranged in the sensing area of the current sensor package.

24. The current sensor system according to claim 16, wherein a width of the calibration conductor is smaller than a width of the current sensor package by at least a factor of two.

25. A means for sensing a current flowing in a primary conductor of a substrate, wherein the means for sensing the current comprises:
  a circuit means for providing a calibration current for a calibration conductor of the substrate, wherein the calibration conductor and the primary conductor are in a defined spatial relation to each other on the substrate, and wherein the calibration conductor and the primary conductor are arranged in a defined spatial relation to each other on the substrate, and wherein the primary conductor and the calibration conductor are electrically isolated from each other;
  a circuit means for sensing a magnetic field of the primary current flowing in the primary conductor to provide a primary sensor signal and for sensing a magnetic field of the calibration current flowing through the calibration conductor to provide a calibration sensor signal; and
  a circuit means for calibrating the primary sensor signal based on the calibration sensor signal and the defined spatial relation between the primary conductor and the calibration conductor.

26. A method for sensing a current flowing in a primary conductor of a substrate, the method comprising:
  providing a calibration current for a calibration conductor of the substrate using a circuit, wherein the calibration conductor and the primary conductor are arranged in a defined spatial relation to each other on the substrate, and wherein the primary conductor and the calibration conductor are electrically isolated from each other;
  sensing a magnetic field of the primary current flowing in the primary conductor using a sensing circuit to provide a primary sensor signal, and sensing a magnetic field of the calibration current flowing through the calibration conductor using the sensing circuit or another sensing circuit to provide a calibration sensor signal; and
  calibrating the primary sensor signal based on the calibration sensor signal and the defined spatial relation between the primary conductor and the calibration conductor using a calibration circuit.

27. A computer readable non-transitory digital storage medium having stored thereon a computer program having a program code for performing, when running on a computer, a method for sensing a current flowing in a primary conductor of a substrate, the method comprising:
  providing a calibration current for a calibration conductor of the substrate using a circuit, wherein the calibration conductor and the primary conductor are arranged in a defined spatial relation to each other on the substrate, and wherein the primary conductor and the calibration conductor are electrically isolated from each other;
  sensing a magnetic field of the primary current flowing in the primary conductor using a sensing circuit to provide a primary sensor signal, and sensing a magnetic field of the calibration current flowing through the calibration conductor using the sensing circuit or another sensing circuit to provide a calibration sensor signal; and
  calibrating the primary sensor signal based on the calibration sensor signal and the defined spatial relation between the primary conductor and the calibration conductor using a calibration circuit.

* * * * *